(12) United States Patent
Urano et al.

(10) Patent No.: US 9,400,428 B2
(45) Date of Patent: Jul. 26, 2016

(54) POLYMER COMPOUND, CHEMICALLY AMPLIFIED NEGATIVE RESIST COMPOSITION, PHOTO-CURABLE DRY FILM AND PRODUCTION METHOD THEREOF, LAYERED PRODUCT, PATTERNING PROCESS, AND SUBSTRATE

(71) Applicant: SHIN-ETSU CHEMICAL CO., LTD., Tokyo (JP)

(72) Inventors: Hiroyuki Urano, Jyoetsu (JP); Masashi Iio, Jyoetsu (JP); Katsuya Takemura, Jyoetsu (JP); Takashi Miyazaki, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/311,132

(22) Filed: Jun. 20, 2014

(65) Prior Publication Data

US 2015/0056545 A1 Feb. 26, 2015

(30) Foreign Application Priority Data

Aug. 26, 2013 (JP) ................. 2013-174329

(51) Int. Cl.
| | | |
|---|---|---|
| *G03F 7/11* | (2006.01) | |
| *G03F 7/075* | (2006.01) | |
| *C08G 77/16* | (2006.01) | |
| *G03F 7/40* | (2006.01) | |
| *G03F 7/26* | (2006.01) | |
| *C08G 77/38* | (2006.01) | |
| *C08G 77/42* | (2006.01) | |
| *C08G 77/448* | (2006.01) | |
| *C08L 83/04* | (2006.01) | |
| *C08L 83/10* | (2006.01) | |
| *G03G 5/05* | (2006.01) | |
| *G03G 7/00* | (2006.01) | |
| *G03F 7/038* | (2006.01) | |

(52) U.S. Cl.
CPC .............. *G03F 7/0757* (2013.01); *C08G 77/16* (2013.01); *C08G 77/38* (2013.01); *C08G 77/42* (2013.01);*C08G 77/448* (2013.01); *C08L 83/04* (2013.01); *C08L 83/10* (2013.01); *G03F 7/038* (2013.01); *G03F 7/0382* (2013.01); *G03F 7/26* (2013.01); *G03F 7/40* (2013.01); *G03G 5/05* (2013.01); *G03G 7/00* (2013.01); *G03F 7/11* (2013.01)

(58) Field of Classification Search
CPC ........ C08G 77/42; C08G 77/48; C08G 77/16; C08G 77/38; C08G 77/448; C08G 8/28; C08L 83/04; C08L 83/10; G03F 7/004; G03F 7/11; G03F 7/26; G03F 7/38; G03F 7/40
USPC ................ 528/26, 25, 43; 525/474, 471, 450; 430/270.1, 271.1, 311, 322, 325, 329, 430/330, 331
See application file for complete search history.

(56) References Cited

U.S. PATENT DOCUMENTS

| | | | | |
|---|---|---|---|---|
| 4,894,427 A * | 1/1990 | Yamamoto | ........... | C08G 77/445 525/446 |
| 4,945,147 A * | 7/1990 | Policastro | ............ | C08G 77/445 528/25 |
| 5,608,026 A * | 3/1997 | Hoover | ................ | C08G 77/448 528/26 |
| 6,165,662 A | 12/2000 | Kato et al. | | |
| 8,410,238 B2 * | 4/2013 | Ko | .......... | C08G 77/16 528/25 |
| 8,492,450 B2 * | 7/2013 | Araki | .................. | C08F 290/148 522/1 |
| 8,802,804 B2 * | 8/2014 | Kim | ..................... | C08G 64/186 528/25 |
| 8,912,290 B2 * | 12/2014 | Huggins | ................ | C08G 77/04 525/446 |
| 2008/0182087 A1 | 7/2008 | Kato et al. | | |
| 2009/0215222 A1 | 8/2009 | Arai et al. | | |
| 2012/0251750 A1* | 10/2012 | Sybert | .................... | C08L 83/10 428/35.7 |
| 2013/0267665 A1* | 10/2013 | Huggins | ................ | C08G 77/04 525/446 |

| | | |
|---|---|---|
| 2014/0234629 A1* | 8/2014 | Sun ................ C08L 69/005 428/412 |

FOREIGN PATENT DOCUMENTS

| | | |
|---|---|---|
| EP | 1186624 A1 | 3/2002 |
| JP | H0253057 A | 2/1990 |
| JP | H04189811 A | 7/1992 |
| JP | A-2008-184571 | 8/2008 |
| JP | A-2009-200315 | 9/2009 |

OTHER PUBLICATIONS

Feb. 2, 2015 Extended Search Report issued in European Application No. 14002320.1.

\* cited by examiner

*Primary Examiner* — Amanda C Walke
(74) *Attorney, Agent, or Firm* — Oliff PLC

(57) ABSTRACT

A polymer compound includes a carboxyl group and a siloxane chain and is obtained in the presence of an acid catalyst by condensation of at least; (I) a siloxane compound having phenol groups at both terminals, as shown by formula (1), (II) phenols shown by formula (2) and/or phenols shown by formula (3), and (III) one or more kinds of aldehydes and ketones shown by the following general formula (4). The polymer compound can be used suitably as a base resin of a chemically amplified negative resist composition with which the problem of delamination generated on metal wires, an electrode, and a substrate, can be improved, and with which a fine pattern can be formed without generating a scum and a footing profile in the pattern bottom and on the substrate, using a widely used aqueous 2.38% TMAH solution as a developer.

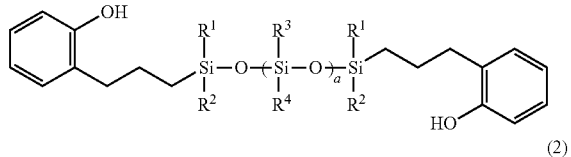

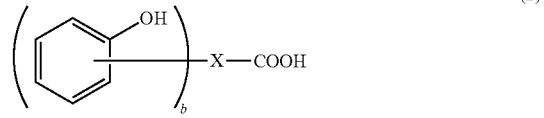

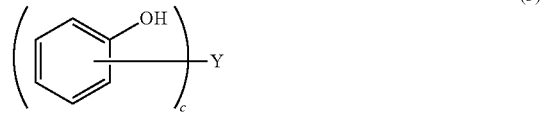

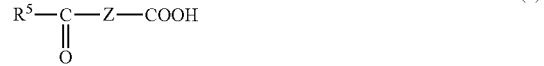

21 Claims, 1 Drawing Sheet

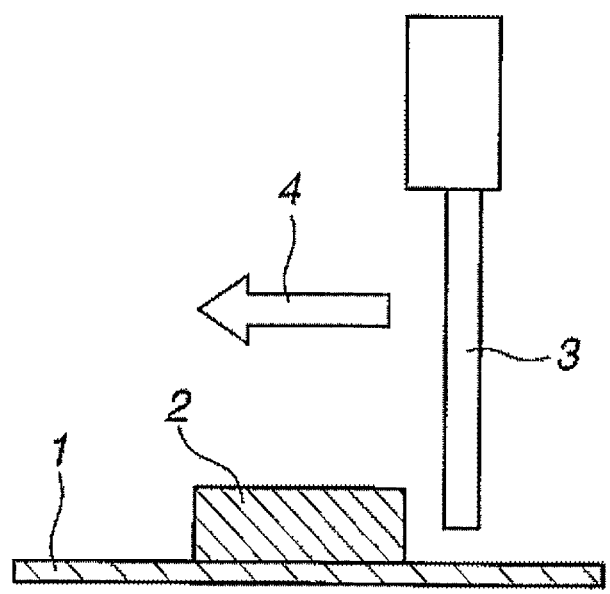

POLYMER COMPOUND, CHEMICALLY AMPLIFIED NEGATIVE RESIST COMPOSITION, PHOTO-CURABLE DRY FILM AND PRODUCTION METHOD THEREOF, LAYERED PRODUCT, PATTERNING PROCESS, AND SUBSTRATE

BACKGROUND OF THE INVENTION

1. Field of the Invention

The present invention relates to a polymer compound, a chemically amplified negative resist composition using the polymer compound, a photo-curable dry film formed by using the chemically amplified negative resist composition and a production method thereof, a layered product having the photo-curable dry film laminated on a substrate, a patterning process using the chemically amplified negative resist composition and the photo-curable dry film, and a substrate obtained by the patterning process.

2. Description of the Related Art

In accordance with progress of various electronic devices including a personal computer, a digital camera, and a mobile phone toward downsizing and higher performance, requirements are also rapidly increasing for further downsizing, thinning, and higher density in a semiconductor device. Accordingly, development of a photosensitive insulation material is wanted which can respond not only to an increase in surface area of a substrate for the sake of higher productivity but also to a structural body having fine concavity and convexity with a high aspect ratio on a substrate in high density mounting technologies including a chip size packaging or a chip scale packaging (CSP), and a three dimensional lamination.

As to the photosensitive insulating material as mentioned above, a proposal is made (Patent Document 1) with regard to a photo-curable resin composition that can provide a top coat film to protect electric and electronic parts; the composition being capable of coating so as to give a wide range of film thickness by a spin coating method that is usually used in manufacturing process of a semiconductor device, capable of fine patterning in a wide range of wavelength, and having excellent flexibility, heat resistance, electric characteristics, adhesiveness, reliability, and chemical resistance by post-cure at low temperature. This spin coating method has an advantage that a film can be conveniently formed on a substrate.

On the other hand, although the above-mentioned photo-curable resin composition to provide the top coat film to protect electric and electronic parts is used with the film thickness of 1 to 100 μm on a substrate, practically there is a limit in the photo-curable resin composition because when the film thickness thereof goes beyond about 30 μm, its viscosity coefficient becomes so high that to form a film on a substrate by a spin coating method becomes difficult.

In addition, it is difficult to cover the substrate almost evenly by the photo-curable resin composition when it is applied by a spin coating method on a substrate having a concavity and a convexity on its surface. Because of this, the photo-curable resin layer tends to readily form a space on the uneven part of the substrate; and thus, further improvements in flattening and in covering of the uneven surface have been waited. As the alternative coating method in place of a spin coating method, a spray coating method is proposed (Patent Document 2). However, in principle, this method tends to readily cause defects such as different heights due to the concavity and the convexity of a substrate, film loss in the pattern edge, and a pinhole in the concavity bottom; and thus, problems related to flattening and covering of the uneven surface have not been fully solved yet.

In recent years, in high density mounting technologies including a chip size packaging or a chip scale packaging (CSP) and a three dimensional lamination, a technology by which a fine pattern having a high aspect ratio is formed on a substrate, followed by laminating the pattern thus obtained with a metal including copper whereby rewiring from a chip is very active. As the chip advances toward higher density and integration, requirements for miniaturization of a pattern width and a contact hole size to connect between substrates in the rewiring technology is very strong. To obtain a fine pattern, a lithography technology is generally used, and among others, a chemically amplified negative resist composition is suitable to obtain a fine pattern. Moreover, the pattern used for rewiring not only permanently exists in a device and between chips but also needs to work as a top coat film that is curable and also has excellent flexibility, heat resistance, electric characteristics, adhesiveness, reliability, and chemical resistance to protect electric and electronic parts; and therefore, it is said that the resist composition to obtain the pattern is preferably of a negative type.

As mentioned above, a chemically amplified negative resist composition is suitable as the composition for a patterning process that is capable of processing a fine rewire and of forming a top coat film having excellent flexibility, heat resistance, electric characteristics, adhesiveness, reliability, and chemical resistance to protect electric and electronic parts.

PRIOR ART DOCUMENTS

Patent Documents

Patent Document 1: Japanese Patent Laid-Open Publication No. 2008-184571
Patent Document 2: Japanese Patent Laid-Open Publication No. 2009-200315

SUMMARY OF THE INVENTION

On the other hand, the chemically amplified negative resist composition which is capable of forming a fine pattern to be used for processing a rewire and is useful for a top coat film to protect electric and electronic parts occasionally covers over a Cu wiring which is processed on a substrate in advance or over an Al electrode which is present on a substrate. In addition, among the substrates provided with a wire and an electrode, there is also an insulating substrate such as SiN, which needs to be covered widely. However, adhesion between a covering layer formed of the chemically amplified negative resist composition and these substrates is not sufficient yet, so that there often occurs a problem that the covering layer formed of the resist composition is delaminated from the substrate.

Moreover, during the time of patterning by using the chemically amplified negative resist composition useful for the top coat film to protect electric and electronic parts, an organic solvent is used often as a developing solution in development. In this case, the exposed part becomes insoluble in an organic solvent developer by a crosslinking reaction and the like, while the unexposed part is readily soluble in this organic solvent developer, thereby obtaining a pattern.

However, there is an idea that development by the organic solvent developer is not desirable in view of treatment of waste liquid after development, load to an environment, and so forth. Moreover, the organic solvent developer is so expensive that development by an aqueous alkaline solution including an aqueous 2.38% tetramethyl ammonium hydroxide (TMAH) solution which is cheap and widely used in lithography patterning is preferred.

In development using the aqueous alkaline solution including the aqueous 2.38% TMAH solution, some negative resist compositions used in recent years have small difference in solubilities to the developer between the exposed part and the unexposed part, in other word, a so-called dissolution contrast therebetween is sometimes small. When the dissolution contrast is small, formation of a good pattern to satisfy requirement of a fine pattern may not be expected always. In addition, when the dissolution contrast is small, there is a fear that a pattern cannot be formed on a substrate faithfully to a mask used in exposure transformation and in formation of the pattern. Accordingly, the resist composition is requested to have the highest dissolution contrast as possible in the use of the aqueous alkaline developer, that is, to enhance the resolution power is requested in the resist composition.

Moreover, in the chemically amplified negative resist composition which is capable of forming a fine pattern to be used for processing a rewire and is useful for the top coat film to protect electric and electronic parts, sufficient solubility of the unexposed part to the aqueous alkaline developer is important. In other words, if solubility of the unexposed part in the aqueous alkaline developer is poor, and in the case that the resist composition film to cover the substrate is thick or the like, sometimes observed are the pattern deteriorations such as an undissolved residue or a scum in the pattern bottom, and a footing profile in the pattern on the substrate. The scum and footing profile as mentioned above sometimes cause problems including disconnection of an electric circuit and wire during a rewiring process; and thus, it is necessary to suppress generation of such problems from occurring.

Accordingly, drastic improvement of adhesion on the substrate is wanted while not only maintaining the fine patterning ability in the rewiring technology required in accordance with the trends to higher density and higher integration of chips and but also being the chemically amplified negative resist composition useful for a top coat film to protect electric and electronic parts; and in addition, wanted is prompt building up of the system in which patterning is possible by a widely used aqueous alkaline developer such as the aqueous 2.38% TMAH solution, further improvement in the resolution power can be expected, and a scum and a footing profile are not generated in the pattern bottom.

The present invention was made in view of the situation mentioned above, and thus, the present invention has an object to provide a polymer compound and a chemically amplified negative resist composition using this polymer compound, wherein the polymer compound can be used suitably as a base resin of the chemically amplified negative resist composition with which the problem of delamination generated on metal wires such as Cu and Al, an electrode, and a substrate, especially the substrate such as SiN, can be improved, and in addition, with which a fine pattern can be formed without generating a scum and a footing profile in the pattern bottom and on the substrate by using the widely used aqueous 2.38% TMAH solution as a developer.

Another object of the present invention is to provide a patterning process with which a fine pattern can be conveniently formed on a substrate by applying the above-mentioned chemically amplified negative resist composition by a spin coating method.

Further objects of the present invention are to provide a photo-curable dry film using the chemically amplified negative resist composition, a method for producing the photo-curable dry film, a layered product having the photo-curable dry film laminated on a substrate, and a patterning process to form a fine pattern by forming even on the substrate having a concavity and a convexity a resist layer having a wide range of film thickness by using the photo-curable dry film.

Furthermore, the present invention has another object to provide a substrate protected by a cured film which is obtained by post-curing at low temperature a pattern obtained by the above-mentioned patterning process and having excellent flexibility, heat resistance, electric characteristics, adhesiveness, reliability, chemical resistance, crack resistance, and fill-up performance.

To solve the problems as mentioned above, the present invention provides a polymer compound, wherein the polymer compound comprises a carboxyl group and a siloxane chain and is obtained in the presence of an acid catalyst by condensation of at least (I) a siloxane compound having phenol groups at both terminals, as shown by the following general formula (1),

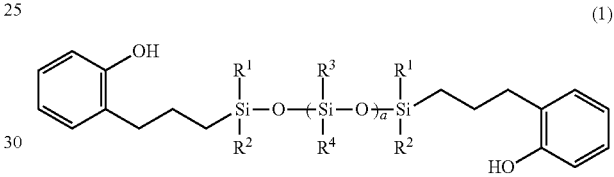

wherein $R^1$ to $R^4$ are each individually a monovalent hydrocarbon group having 1 to 8 carbon atoms; and "a" represents an integer of 1 to 100, (II) phenols shown by the following general formula (2) and/or phenols shown by the following general formula (3),

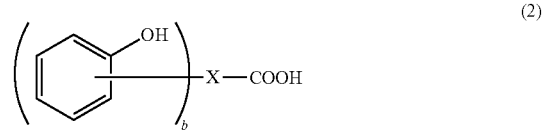

wherein "b" is 1 or 2; and X represents a single bond or a divalent organic group when "b" is 1, or a trivalent organic group when "b" is 2, wherein when "b" is 1,

wherein "c" is 1 or 2; and Y represents a monovalent substituent group selected from a hydrogen atom, an alkyl group having 1 to 6 carbon atoms, a hydroxyl group, and a halogen atom when "c" is 1, or a divalent organic group optionally containing an atom of Si, S, or O when "c" is 2, and (III) one or more kinds of aldehydes and ketones shown by the following general formula (4),

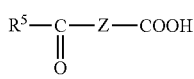 (4)

wherein $R^5$ represents a hydrogen atom or a methyl group; and Z represents a divalent alkylene group or an aromatic group having 1 to 12 carbon atoms.

The polymer compound as mentioned above can improve the problem of delamination generated on metal wires such as Cu and Al, an electrode, and a substrate, especially the substrate such as SiN, and in addition, this polymer can be a base resin of a chemically amplified negative resist composition with which a fine pattern can be formed without generating a scum and a footing profile in the pattern bottom and on the substrate by using the widely used aqueous 2.38% TMAH solution as a developer.

In this case, the above-mentioned polymer compound is preferably a polymer compound obtained in the presence of an acid catalyst by condensation by further adding (IV) one or more kinds of aldehydes and ketones shown by the following general formula (5),

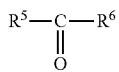 (5)

wherein $R^5$ represents the same meaning as before; and $R^6$ represents a hydrogen atom, an alkyl group or an aromatic group having 1 to 15 carbon atoms, wherein $R^5$ and $R^6$ may be connected by a single bond or an alkylene group having 1 to 15 carbon atoms to form a ring.

The polymer compound like this can further enhance the effects of the present invention.

In this case, the above-mentioned siloxane compound having phenol groups at both terminals as shown by the general formula (1) is preferably a compound shown by the following general formula (6),

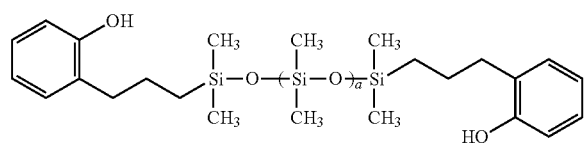 (6)

wherein "a" represents the same meaning as before.

The polymer compound like this is easily synthesized; and in addition, when this is used as a material for a chemically amplified negative resist composition, solubility thereof into a developer is not hampered during the patterning by using an aqueous alkaline solution including an aqueous 2.38% TMAH solution as the developer.

Further in this case, the phenols shown by the general formula (2) are preferably any of compounds shown by the following general formulae (7).

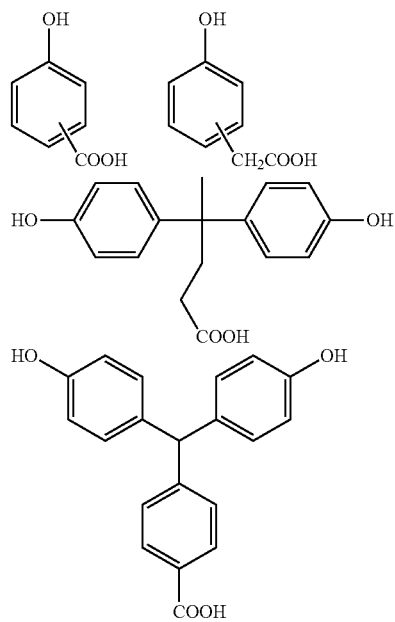 (7)

Further in this case, the phenols shown by the general formula (3) are preferably compounds shown by the following general formula (8),

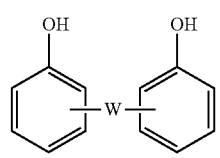 (8)

wherein W represents a divalent organic group having any of the structures shown by the following general formulae (9),

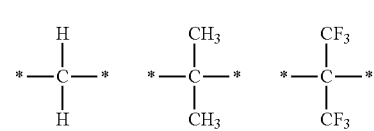

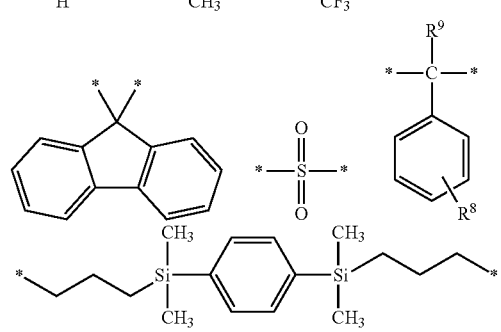 (9)

wherein $R^8$ represents a monovalent substituent group selected from a hydrogen atom, an alkyl group having 1 to 6 carbon atoms, a hydroxyl group, and a halogen atom; and $R^9$ represents a hydrogen atom or a methyl group.

In the polymer compound of the present invention, the above-mentioned phenols may be suitably blended.

Further in this case, one of the aldehydes and the ketones shown by the general formula (4) is preferably a compound shown by the following general formula (10).

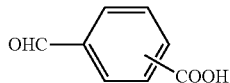
(10)

Further in this case, one of the aldehydes and the ketones shown by the general formula (5) is preferably a compound shown by the following general formula (11),

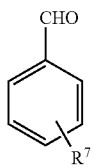
(11)

wherein $R^7$ represents a hydrogen atom, an alkyl group having 1 to 6 carbon atoms, or a halogen atom.

In the polymer compound of the present invention, the above-mentioned aldehydes and ketones may be suitably blended.

Especially, one of the aldehydes and the ketones shown by the general formula (5) is preferably formaldehyde.

Further in this case, the above-mentioned polymer compound preferably has repeating units shown by the following general formula (12) and weight average molecular weight in the range of 3,000 to 500,000,

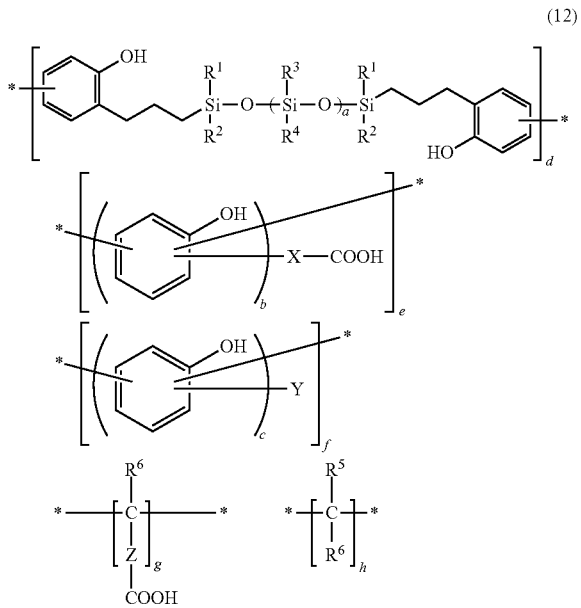
(12)

wherein $R^1$ to $R^6$, "a", "b", "c", X, Y, and Z represent the same meanings as before; "d" and "g" represent a positive number; "e", "f", and "h" represent 0 or a positive number; and d+e+f+g+h=1.

The polymer compound like this has a suitable viscosity coefficient of the polymer compound itself; and thus, a chemically amplified negative resist composition and a photo-curable resin layer of a photo-curable dry film can have suitable viscosity coefficients if this polymer compound is used therein.

Further in this case, in the general formula (12), preferably "d" is $0<d\leq0.5$, "e" is $0\leq e\leq0.3$, "g" is $0<g<0.8$, and "h" is $0\leq h\leq0.5$.

The polymer compound like this, when used in a chemically amplified negative resist composition, has a suitable solubility into a developer in the patterning using an aqueous alkaline solution including an aqueous 2.38% TMAH solution as the developer; and thus, even if a resist composition film to cover a substrate is thick, occurring pattern deteriorations such as an undissolved residue or a scum in the pattern bottom, and a footing profile in the pattern on the substrate can be suppressed, so that an excellent pattern can be obtained. Moreover, occurring a problem that a pattern cannot be obtained because a crosslinking reaction to obtain a negative pattern does not proceed to the insoluble stage can be suppressed. In addition, when it is used for a photo-curable dry film, the processability thereof is not hampered because the adhesiveness of the formed film is appropriate.

Moreover, the present invention provides a chemically amplified negative resist composition comprising:

(A) any of the afore-mentioned polymer compounds, (B) one or more crosslinking agents selected from an amino condensate modified by formaldehyde or formaldehyde-alcohol, a phenol compound having average 2 or more methylol groups or alkoxy methylol groups in one molecule, and a compound having a hydroxyl group of a polyvalent phenol thereof substituted by a glycidoxy group, (C) a photosensitive acid generator which generates an acid by decomposition thereof by a light having wavelength of 190 to 500 nm, and (D) a solvent.

The chemically amplified negative resist composition as mentioned above can improve the problem of delamination generated on metal wires such as Cu and Al, an electrode, and a substrate, especially the substrate such as SiN; and in addition, can form a fine pattern without generating a scum and a footing profile in the pattern bottom and on the substrate by using the widely used aqueous 2.38% TMAH solution as a developer. In addition, post-curing of it at low temperature can give a cured film having excellent flexibility, heat resistance, electric characteristics, adhesiveness, reliability, chemical resistance, crack resistance, and fill-up performance.

In addition, the present invention provides a photo-curable dry film which has a structure that a photo-curable resin layer having a film thickness of 10 to 100 μm is sandwiched between a supporting film and a top coat film, in which the photo-curable resin layer is formed by the afore-mentioned chemically amplified negative resist composition.

The photo-curable dry film as mentioned above can form a fine pattern in the wide ranges of film thickness and wavelength, and can give by post-curing at low temperature a cured film having excellent flexibility, heat resistance, electric characteristics, adhesiveness, reliability, chemical resistance, crack resistance, and fill-up performance.

Moreover, the present invention provides a method for producing a photo-curable dry film, wherein the method comprises:

(i) a step of continuously applying the afore-mentioned chemically amplified negative resist composition onto a supporting film to form a photo-curable resin layer, (ii) a step of continuously drying the photo-curable resin layer, and further (iii) a step of laminating a top coat film onto the photo-curable resin layer.

When the method for producing a photo-curable dry film as mentioned above is used, a photo-curable dry film with a high quality can be produced.

Furthermore, the present invention provides a layered product which has the photo-curable resin layer of the aforementioned photo-curable dry film laminated on a substrate having a trench and/or a hole with an aperture width thereof in the range of 10 to 100 μm and the depth thereof in the range of 10 to 120 μm.

In the layered product as mentioned above, the pattern can be adequately embedded therein so that the layered product excellent in various properties may be obtained.

Moreover, the present invention provides a patterning process comprising:

a step of applying the afore-mentioned chemically amplified negative resist composition onto a substrate to form a resist film, a step of exposing the resist film to a high energy beam having a wavelength of 190 to 500 nm or an electron beam via a photomask after heat treatment, and a step of development by using a developer after heat treatment.

When the patterning process as mentioned above is used, the problem of delamination generated on metal wires such as Cu and Al, an electrode, and a substrate, especially the substrate such as SiN, can be improved; and in addition, a fine pattern can be formed without generating a scum and a footing profile in the pattern bottom and on the substrate by using the widely used aqueous 2.38% TMAH solution as a developer. Furthermore, the chemically amplified negative resist composition can be applied by a spin coating method.

In addition, the present invention provides a patterning process comprising:

a step of adhering onto a substrate a photo-curable resin layer which becomes exposed by delaminating the top coat film from the afore-mentioned photo-curable dry film, a step of exposing the photo-curable resin layer to a high energy beam having a wavelength of 190 to 500 nm or an electron beam via a photomask under the state of intervention of the supporting film or under the state of the supporting film delaminated, a step of heat treatment after the exposure, and a step of development by a developer.

When the patterning process as mentioned above is used, the problem of delamination generated on metal wires such as Cu and Al, an electrode, and a substrate, especially the substrate such as SiN, can be improved; and in addition, a fine pattern can be formed without generating a scum and a footing profile in the pattern bottom and on the substrate by using the widely used aqueous 2.38% TMAH solution as a developer.

Further in this case, it is preferable that the afore-mentioned patterning process include a step of post-curing a patterned film formed by the development at 100 to 250° C. after the step of development.

The cured film thus obtained has excellent flexibility, adhesion with a substrate, heat resistance, electric characteristics, mechanical strength, and chemical resistance to a soldering flux liquid; and thus, a semiconductor device having the cured film like this as the top coat film for it has superior reliability, in particular generation of a crack during a thermal cycle test can be prevented from occurring.

Further in this case, the afore-mentioned substrate may be a substrate having a trench and/or a hole with an aperture width thereof in the range of 10 to 100 μm and the depth thereof in the range of 10 to 120 μm.

When the photo-curable dry film of the present invention is used, a resist film having a wide range of film thickness can be formed even on the substrate having a concavity and a convexity, so that a fine pattern can be formed.

In addition, the present invention provides a substrate that is protected by a film which is obtained by curing the pattern formed by the above-mentioned patterning process.

The substrate as mentioned above becomes a substrate that is protected by the cured film having excellent flexibility, heat resistance, electric characteristics, adhesiveness, reliability, chemical resistance, crack resistance, and fill-up performance.

As mentioned above, according to the present invention, a polymer compound and a chemically amplified negative resist composition using this polymer compound can be obtained, wherein the polymer compound can be used suitably as a base resin of the chemically amplified negative resist composition with which the problem of delamination generated on metal wires such as Cu and Al, an electrode, and a substrate, especially the substrate such as SiN, can be dramatically improved. By using this chemically amplified negative resist composition, a fine pattern can be formed without generating a scum and a footing profile in a wide range of wavelength; and in addition, miniaturization of the pattern is possible in the rewiring technology in accordance with the trend to higher density and higher integration of chips. This chemically amplified negative resist composition can be developed by an aqueous alkaline solution including the aqueous TMAH solution, whereby providing a photo-curable dry film using this chemically amplified negative resist composition and a patterning process using this photo-curable dry film. When the pattern formed by the patterning process like this is post-cured at low temperature, a substrate protected by a cured film having excellent flexibility, heat resistance, electric characteristics, adhesiveness, reliability, chemical resistance, crack resistance, and fill-up performance can be obtained. That is, the chemically amplified negative resist composition of the present invention and the photo-curable dry film using this can give a top coat film suitable to protect electric and electronic parts, a semiconductor device, and the like.

BRIEF DESCRIPTION OF THE DRAWING

FIG. 1 This is an explanatory drawing showing the adhesiveness measurement method in Examples.

DETAILED DESCRIPTION OF THE PREFERRED EMBODIMENTS

As mentioned above, drastic improvement of adhesion on a substrate is wanted while maintaining the fine patterning ability in the rewiring technology required in accordance with the trends to higher density and higher integration of chips and at the same time serving as a chemically amplified negative resist composition useful for a top coat film to protect electric and electronic parts; and in addition, wanted is a prompt build-up of a system in which patterning is possible by a widely used aqueous alkaline developer such as the aqueous 2.38% TMAH solution, further improvement in the resolution power can be expected, and a scum and a footing profile are not generated in the pattern bottom.

Inventors of the present invention carried out an extensive investigation to achieve the above object; and as a result, it was found that a chemically amplified negative resist composition containing the polymer compound of the present invention could form a fine pattern, whereby leading to drastic improvement of the problem of delamination generated on metal wires such as Cu and Al, an electrode, and a substrate, especially the substrate such as SiN. In addition, it was found that a cured film obtained by the patterning process using the resist composition like this was excellent as a top coat film to protect electric and electronic parts. The present invention was accomplished by this information.

Hereunder, the present invention will be explained in detail; but the present invention is not limited to these.

The present invention is a polymer compound, wherein the polymer compound has a carboxyl group and a siloxane chain and is obtained in the presence of an acid catalyst by condensation of at least (I) a siloxane compound having phenol groups at both terminals, as shown by the following general formula (1), (II) phenols shown by the following general formula (2) and/or phenols shown by the following general formula (3), and (III) one or more kinds of aldehydes and ketones shown by the following general formula (4).

(I) The siloxane compound having phenol groups at both terminals, as shown by the following general formula (1), will be shown hereunder,

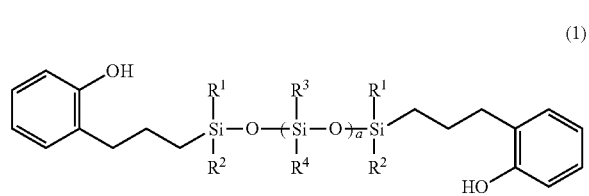

(1)

wherein $R^1$ to $R^4$ represent the same or different monovalent hydrocarbon group having 1 to 8 carbon atoms; and "a" represents an integer of 1 to 100.

$R^1$ to $R^4$ in the formula (1) represent the same or different monovalent hydrocarbon group having 1 to 8 carbon atoms, or preferably monovalent hydrocarbon group having 1 to 6 carbon atoms. When the carbon number is in this range, solubility of the polymer compound into a developer in the patterning using an aqueous alkaline developer including the aqueous 2.38% TMAH solution is not hampered.

Specific example of the $R^1$ to $R^4$ as mentioned above includes a linear, a branched, or a cyclic alkyl group such as a methyl group, an ethyl group, a propyl group, an isopropyl group, a n-butyl group, a tert-butyl group, and a cyclohexyl group; a linear, a branched, or a cyclic alkenyl group such as a vinyl group, an allyl group, a propenyl group, a butenyl group, a hexenyl group, and a cyclohexenyl group; an aryl group such as a phenyl group and a tolyl group; and an aralkyl group such as a benzyl group and a phenylethyl group.

In view of easy synthesis and the like, the most preferable hydrocarbon of the above-mentioned $R^1$ to $R^4$ is a methyl group. The siloxane compound having a methyl group as $R^1$ to $R^4$ is shown by the following general formula (6),

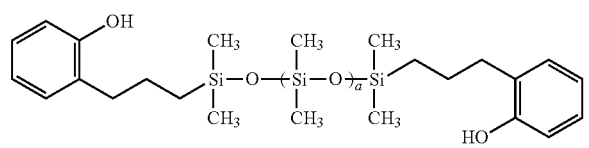

(6)

wherein "a" represents the same meaning as before.

In the general formula (1), "a" represents an integer of 1 to 100, preferably an integer of 1 to 40, or more preferably an integer of 10 to 40. If "a" is 100 or less, the solubility into a developer is not hampered in the patterning using an aqueous alkaline solution including the aqueous 2.38% TMAH solution as the developer. In addition, if "a" is 100 or less, adhesiveness of a formed film is appropriate and the processability thereof is not hampered; and thus, when a photo-curable dry film having a structure that the photo-curable resin layer is sandwiched between a supporting film and a top coat film (this will be mentioned later), the top coat film won't be difficult to be removed. If "a" is 1 or more, electric characteristics that are important for a top coat film to protect electric and electronic parts and flexibility that is necessary for a top coat film are not hampered.

The siloxane compound having phenol groups at both terminals as shown by the general formula (1) can be readily obtained by a general hydrosilylation reaction in which a siloxane compound having the SiH groups at the terminals as shown by the following general formula (13) is reacted with 2-allylphenol as shown by the following structural formula (14) in the presence of a platinum catalyst.

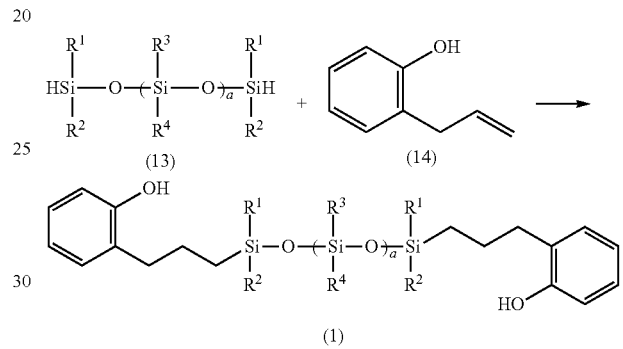

(II) The phenols shown by the following general formula (2) will be shown hereunder,

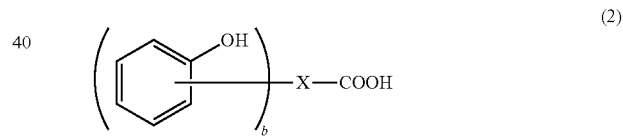

(2)

wherein "b" is 1 or 2; and X represents a divalent organic group when "b" is 1, or a trivalent organic group when "b" is 2, wherein when "b" is 1, the carboxyl group may be directly bonded to the phenol group without intervention of X.

Illustrative example of the compound in which "b" in the general formula (2) is 1 and the carboxyl group is directly bonded with the phenol group without intervention of X includes salicylic acid, 3-hydroxybenzoic acid, and 4-hydroxybenzoic acid.

Illustrative example of the compound in which "b" in the general formula (2) is 1 and X is a divalent organic group includes, in the case that X is —$CH_2$—, 2-hydroxyphenylacetic acid, 3-hydroxyphenylacetic acid, and 4-hydroxyphenylacetic acid, and in the case that X is —$CH_2CH_2$—, 3-(2-hydroxyphenyl)propionic acid and 3-(4-hydroxyphenyl)propionic acid.

The compound in which "b" in the general formula (2) is 2 and X is a trivalent organic group may be exemplified by the compound shown by the following general formulae (7').

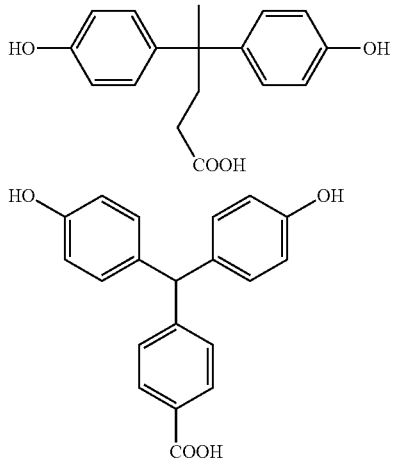

(II) The phenols shown by the following general formula (3) are shown below,

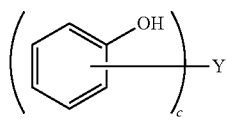

(3)

wherein "c" is 1 or 2; and Y represents a monovalent substituent group selected from a hydrogen atom, an alkyl group having 1 to 6 carbon atoms, a hydroxyl group, and a halogen atom when "c" is 1, or a divalent organic group optionally containing an atom of Si, S, or O when "c" is 2.

In the general formula (3), when "c" is 1, Y represents monovalent substituent group selected from a hydrogen atom, an alkyl group having 1 to 6 carbon atoms, a hydroxyl group, and a halogen atom, wherein suitable illustrative example of the alkyl group includes a methyl group, an ethyl group, a n-propyl group, an isopropyl group, a n-butyl group, a t-butyl group, and a n-hexyl group.

In the general formula (3), when "c" is 2, Y represents a divalent organic group optionally containing an atom of Si, S, or O. That is, the compound shown by the general formula (3) may be exemplified by compounds shown by the following general formula (8),

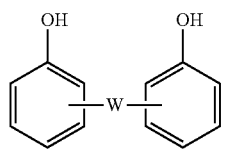

(8)

wherein W represents a divalent organic group having any one of the structures shown by the following general formulae (9),

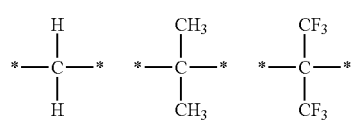

(9)

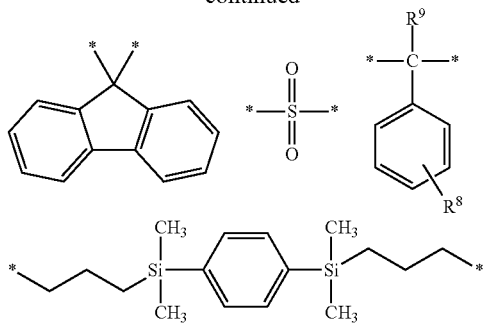

wherein $R^8$ represents a monovalent substituent group selected from a hydrogen atom, an alkyl group having 1 to 6 carbon atoms, a hydroxyl group, and a halogen atom; and $R^9$ represents a hydrogen atom or a methyl group.

Among the compounds shown by the general formula (8), the compound shown below is especially preferable.

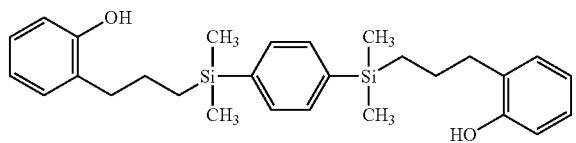

In addition, the polymer compound of the present invention may include either of the phenols shown by the general formula (2) or the phenols shown by the general formula (3), or both of them.

(III) The aldehydes and the ketones shown by the following general formula (4) will be shown hereunder,

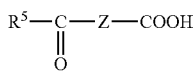

(4)

wherein $R^5$ represents a hydrogen atom or a methyl group; and Z represents a divalent alkylene group or an aromatic group having 1 to 12 carbon atoms.

Specific example of the aldehydes and the ketones as mentioned above includes following compounds.

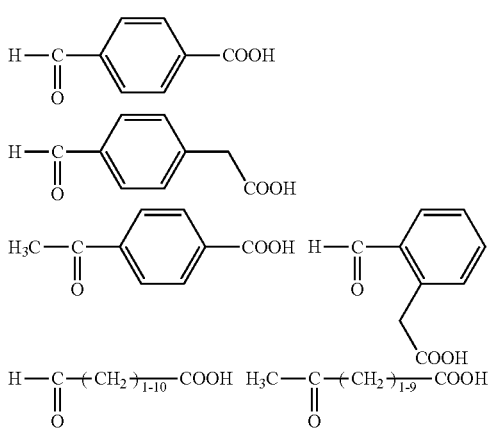

-continued

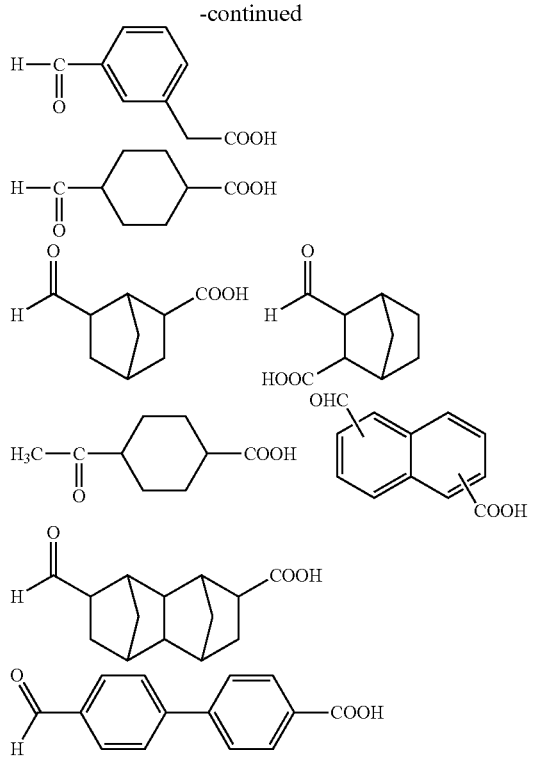

Among these compounds, especially the compound shown by the following general formula (10) is preferably used.

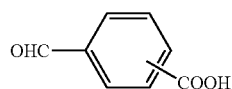
(10)

These aldehydes and ketones shown by the general formula (4) may be used solely or as a mixture of two or more of them.

In this case, it is preferable to further add (IV) one or more kinds of aldehydes and ketones shown by the following general formula (5),

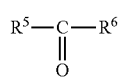
(5)

wherein $R^5$ represents the same meaning as before; and $R^6$ represents a hydrogen atom, an alkyl group or an aromatic group having 1 to 15 carbon atoms, wherein $R^5$ and $R^6$ may be connected by an alkylene group having 1 to 15 carbon atoms.

In the general formula (5), $R^6$ represents a hydrogen atom, an alkyl group or an aromatic group having 1 to 15 carbon atoms; and specific example of this compound includes formaldehyde, acetaldehyde, propionaldehyde, butylaldehyde, isobutylaldehyde, cyclohexane carboxaldehyde, benzaldehyde, 4-hydroxybenzaldehyde, 3-hydroxybenzaldehyde, acetone, acetophenone, and 2-butanone. In addition, $R^5$ and $R^6$ may be connected by an alkylene group having 1 to 15 carbon atoms; and illustrative example of this compound includes cyclopentanone, cyclohexanone, cycloheptanone, indanone, and fluorenone.

Among them, especially formaldehyde and a benzaldehyde derivative shown by the following general formula (11) are preferable.

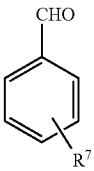
(11)

These aldehydes and ketones shown by the general formula (5) may be used solely or as a mixture of two or more of them.

The polymer compound of the present invention may be obtained in the presence of an acid catalyst by condensation of (I) a siloxane compound having phenol groups at both terminals as shown by the general formula (1), (II) phenols shown by the general formula (2) and/or phenols shown by the general formula (3), and (III) one or more kinds of aldehydes and ketones shown by the general formula (4). In addition, it is preferable to carry out the condensation in the presence of an acid catalyst by adding (IV) one or more kinds of aldehydes and ketones shown by the general formula (5) to the compounds (I) to (III).

The polymer compound of the present invention may be obtained readily by carrying out the condensation reaction (for example, dehydration condensation) of the above-mentioned corresponding compounds usually without a solvent or in a solvent by using an acid at room temperature or, as necessarily, with cooling or heating.

Illustrative example of the solvent used in this condensation reaction includes alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethylformamide, and hexamethyl phosphoric triamide; and these solvents may be used solely or as a mixture of two or more kinds of them. These solvents may be used with the amount in the range of 0 to 2,000 parts by mass relative to 100 parts by mass of the raw materials of the reaction.

Illustrative example of the acid catalyst to be used in this condensation reaction includes inorganic acids such as hydrochloric acid, hydrobromic acid, sulfuric acid, nitric acid, phosphoric acid, boric acid, and heteropolyacid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dichloro dibutyltin, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide.

The polymer compound obtained by the condensation reaction as mentioned above can be shown by the following general formula (12),

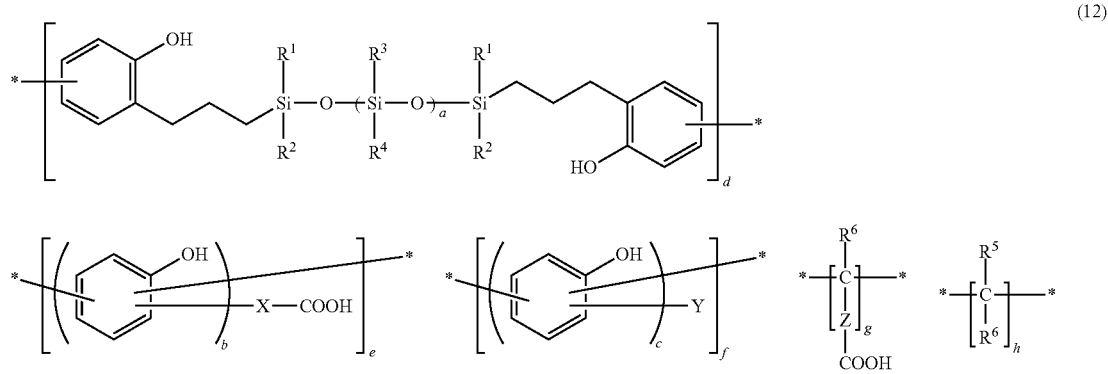

wherein $R^1$ to $R^6$, "a", "b", "c", X, and Y represent the same meanings as before; "d" and "g" represent a positive number; "e", "f", and "h" represent 0 or a positive number; and d+e+f+g+h=1.

In this case, the preferable range of "d" is 0<d≤0.5, or more preferably 0<d≤0.3. If "d" is 0.5 or less, the solubility into a developer is not hampered in the patterning using an aqueous alkaline solution including the aqueous 2.38% TMAH solution as the developer; and thus, this range is preferable. In addition, if "d" is 0.5 or less, adhesiveness of the formed film is appropriate and the processability thereof is not hampered; accordingly, when a photo-curable dry film having a structure that the photo-curable resin layer is sandwiched between a supporting film and a top coat film (this will be mentioned later), the top coat film won't be difficult to be removed; and thus, this range is preferable.

Also, the preferable range of "e" is 0≤e≤0.3.

The range of "g" is preferably 0<g<0.8, more preferably 0<g<0.5, or still more preferably 0.3<g<0.5. If "g" is more than 0, the solubility into a developer is not hampered in the patterning using an aqueous alkaline solution including the aqueous 2.38% TMAH solution as the developer; and thus, a good pattern can be obtained. In other words, if "g" is more than 0 so that solubility of the unexposed part of the negative pattern to the developer is good, even in the case that the resist composition film to cover the substrate is thick, the pattern deteriorations such as an undissolved residue or a scum in the pattern bottom, and a footing profile in the pattern on the substrate can be suppressed. Moreover, if "g" is less than 0.8, the solubility into the aqueous alkaline solution developer is appropriate; and thus, occurring a problem that a pattern cannot be obtained because the crosslinking reaction to obtain a negative pattern does not proceed to the insoluble stage can be suppressed.

Also, the range of "h" is preferably 0≤h≤05, or more preferably 0≤h≤0.3.

The preferable polymer compound of the present invention having the repeating unit shown by the general formula (12) may be exemplified by the polymer compound having the repeating unit shown by the following general formula (15),

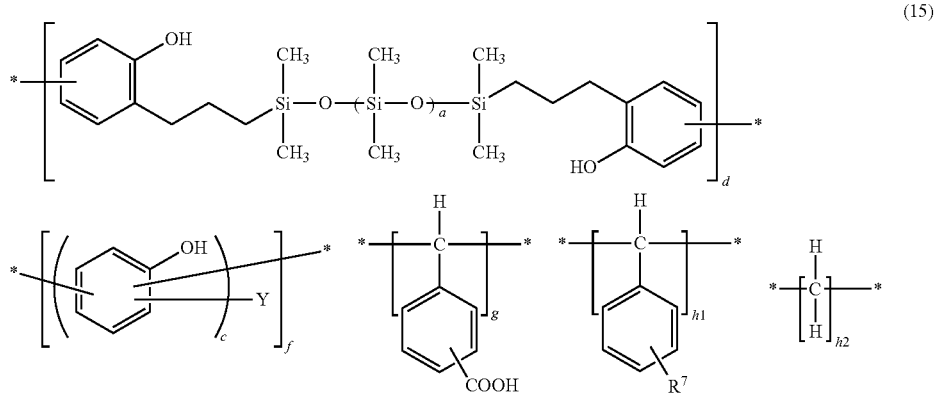

wherein $R^7$, "a", "c", and Y represent the same meanings as before; "d" and "g" represent a positive number; "f", "h1", and "h2" represent 0 or a positive number; and d+f+g+h1+h2=1.

The preferable polymer compound of the present invention having the repeating unit shown by the general formula (12) or the general formula (15) may be exemplified by the polymer compound having the repeating unit shown by the following general formula (16),

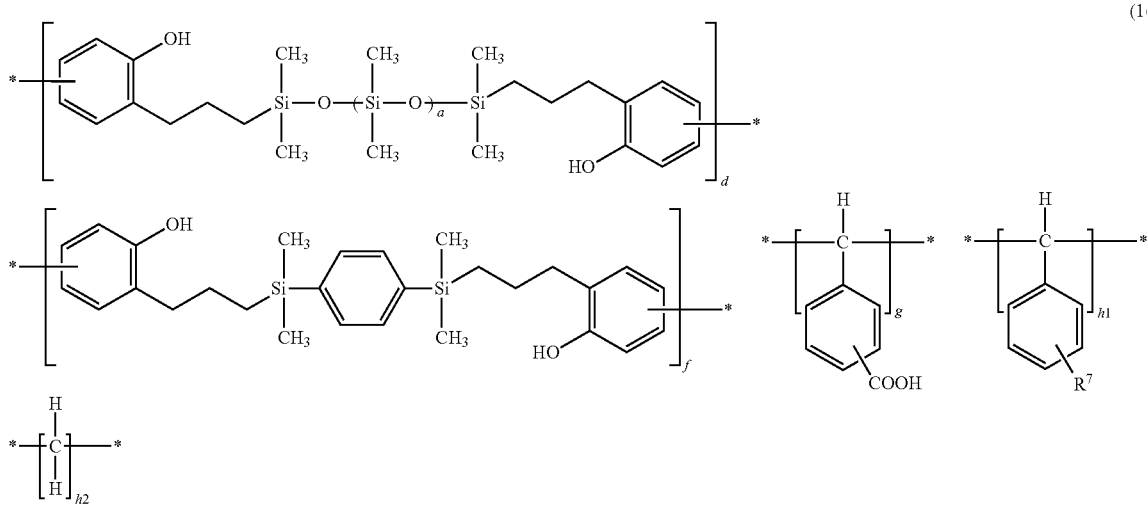

wherein $R^7$ and "a" represent the same meanings as before; "d", "f", "g", "h1", and "h2" represent the same meanings as before; and d+f+g+h1+h2=1.

In the general formula (15) and the general formula (16), the referable ranges of "d", "f", and "g" each is the same as before; and further, h1+h2=h.

The weight average molecular weight of the polymer compound like this is preferably in the range of 3,000 to 500,000. Meanwhile, when the weight average molecular weight of the polymer compound becomes lower, the viscosity coefficient of the polymer decreases as well. Accordingly, also both the viscosity coefficient of a chemically amplified negative resist composition (this will be mentioned later) that uses this polymer compound and the viscosity coefficient of a photo-curable resin layer of a photo-curable dry film (this will be mentioned later) that is formed by using this resist composition decrease.

The polymer compound as mentioned above can be used suitably as a base resin of the chemically amplified negative resist composition with which the problem of delamination generated on metal wires such as Cu and Al, an electrode, and a substrate, especially the substrate such as SiN, can be improved, and in addition, with which a fine pattern can be formed without generating a scum and a footing profile in the pattern bottom and on the substrate by using the widely used aqueous 2.38% TMAH solution as a developer.

Moreover, the present invention provides a chemically amplified negative resist composition comprising:

(A) the afore-mentioned polymer compound, (B) one or more crosslinking agents selected from an amino condensate modified by formaldehyde or formaldehyde-alcohol, a phenol compound having average 2 or more methylol groups or alkoxy methylol groups in one molecule, and a compound having a hydroxyl group of a polyvalent phenol thereof substituted by a glycidoxy group, (C) a photosensitive acid generator which generates an acid by decomposition thereof by a light having wavelength of 190 to 500 nm, and (D) a solvent.

Here, as to (B) the crosslinking agent, one or more crosslinking agents selected from an amino condensate modified by formaldehyde or formaldehyde-alcohol, a phenol compound having average 2 or more methylol groups or alkoxy methylol groups in one molecule, and a compound having a hydroxyl group of a polyvalent phenol thereof substituted by a glycidoxy group may be used.

The above-mentioned amino condensate modified by formaldehyde or formaldehyde-alcohol may be exemplified by a melamine condensate modified by formaldehyde or formaldehyde-alcohol and a urea condensate modified by formaldehyde or formaldehyde-alcohol.

The melamine condensate modified by formaldehyde or formaldehyde-alcohol may be prepared by, for example, a heretofore known method in which a melamine monomer is modified by formalin to a methylol compound thereof, or followed by further modification by an alcohol to an alkoxy compound thereof, thereby obtaining the modified melamine shown by the following general formula (17). Meanwhile, the above-mentioned alcohol is preferably a lower alcohol, for example, an alcohol having 1 to 4 carbon atoms.

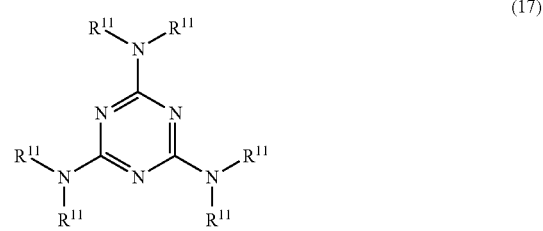

(17)

wherein $R^{11}$ may be the same or different, representing a methylol group, an alkoxymethyl group containing an alkoxy group having 1 to 4 carbon atoms, or a hydrogen atom, wherein one or more of them is a methylol group or an alkoxymethyl group.

Illustrative example of $R^{11}$ includes a hydrogen atom, a methylol group, and alkoxymethyl groups such as a methoxymethyl group and an ethoxymethyl group.

Specific example of the modified melamine shown by the general formula (17) includes trimethoxymethyl monomethylol melamine, dimethoxymethyl monomethylol melamine, trimethylol melamine, hexamethylol melamine, and hexamethoxy methylol melamine.

Then, the modified melamine shown by the general formula (17) or the multimeric compound thereof (oligomers such as, for example, a dimer and a trimer) is polymerized by addition-condensation with formaldehyde until an intended molecular weight is reached by a conventional method, whereby obtaining the melamine condensate modified by formaldehyde or formaldehyde-alcohol.

The urea condensate modified by formaldehyde or formaldehyde-alcohol may be prepared by, for example, a heretofore known method in which an urea condensate having a prescribed molecular weight is modified by formaldehyde to a methylol compound thereof, or followed by further modification by an alcohol to an alkoxy compound thereof.

Specific example of the urea condensate modified by formaldehyde or formaldehyde-alcohol includes a methoxymethylated urea condensate and an ethoxymethylated urea condensate.

Meanwhile, these modified melamine condensates and modified urea condensates may be used solely or as a mixture of two or more of them.

The phenol compound having average 2 or more methylol groups or alkoxy methylol groups in one molecule may be exemplified by (2-hydroxy-5-methyl)-1,3-benzenedimethanol, 2,2',6,6'-tetramethoxymethyl bisphenol A, and the like.

Meanwhile, these phenol compounds may be used solely or as a mixture of two or more of them.

The compound having a hydroxyl group of a polyvalent phenol thereof substituted by a glycidoxy group may be exemplified by 1,1'-diglycidoxy bisphenol A, tris(4-glycidoxyphenyl)methane, 1,1,1-tris(4-glycidoxyphenyl)ethane, and the like, which are obtained by reacting in the presence of a base catalyst the OH groups of bisphenol A, tris(4-hydroxyphenyl)methane, 1,1,1-tris(4-hydroxyphenyl)ethane, and the like, respectively, with epichlorohydrin.

Meanwhile, these compounds having a hydroxyl group of a polyvalent phenol thereof substituted by a glycidoxy group may be used solely or as a mixture of two or more of them.

The crosslinking agent as mentioned above is a component playing a role to facilitate the patterning by undergoing a curing reaction with (A) the polymer compound together with a role to enhance strength of the cured product. The weight average molecular weight of the crosslinking agent is preferably, in view of the photo-curability and the heat resistance thereof, in the range of 150 to 10,000, or especially preferably in the range of 200 to 3,000.

These crosslinking agents may be used solely or as a combination of two or more of them.

In view of reliability as the top coat film to protect electric and electronic parts after photo-cure and post-cure, amount of the crosslinking agent to be blended therein is preferably in the range of 0.5 to 50 parts by mass, or especially preferably in the range of 1 to 30 parts by mass, relative to 100 parts by mass of (A) the polymer compound.

As to (C) the photosensitive acid generator, a compound which can generate an acid by exposure to a light having a wavelength of 190 to 500 nm thereby serving as a curing catalyst may be used. The polymer compound of the present invention has excellent compatibility with the photosensitive acid generators, so that various photosensitive acid generators may be used.

Illustrative example of the photosensitive acid generator as mentioned above includes an onium salt, a diazomethane derivative, a glyoxime derivative, a β-ketosulfone derivative, a disulfone derivative, a nitrobenzylsulfonate derivative, a sulfonate ester derivative, an imide-yl-sulfonate derivative, an oximesulfonate derivative, an iminosulfonate derivative, and a triazine derivative.

The onium salt may be exemplified by a compound shown by the following general formula (18), $$(R^{12})_jM^+K^- \quad (18)$$

wherein $R^{12}$ represents an optionally substituted linear, branched, or cyclic alkyl group having 1 to 12 carbon atoms, an aryl group having 6 to 12 carbon atoms, or an aralkyl group having 7 to 12 carbon atoms; $M^+$ represents an iodonium or an sulfonium; and $K^-$ represents a non-nucleophilic counter ion; and "j" is 2 or 3.

In the above-mentioned $R^{12}$, illustrative example of the alkyl group includes a methyl group, an ethyl group, a propyl group, a butyl group, a cyclohexyl group, a 2-oxocyclohexyl group, a norbornyl group, and an adamantyl group. Illustrative example of the aryl group includes a phenyl group; alkoxy phenyl groups such as an o-, m-, or p-methoxyphenyl group, an o-, m-, or p-ethoxyphenyl group, and a m- or p-tert-butoxyphenyl group; and alkyl phenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative example of the aralkyl group includes a benzyl group and a phenethyl group.

Illustrative example of the non-nucleophilic counter ion $K^-$ includes halide ions such as a chloride ion and a bromide ion; fluoroalkyl sulfonates such as triflate, 1,1,1-trifluoroethane sulfonate, and nonafluorobutane sulfonate; aryl sulfonates such as tosylate, benzenesulfonate, 4-fluorobenzenesulfonate, and 1,2,3,4,5-pentafluorobenzenesulfonate; and alkyl sulfonates such as mesylate and butanesulfonate.

The above-mentioned diazomethane derivative may be exemplified by a compound shown by the following general formula (19),

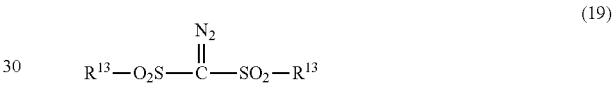

(19)

wherein $R^{13}$ represents the same or different linear, branched, or cyclic alkyl group or halogenated alkyl group having 1 to 12 carbon atoms, aryl group or halogenated aryl group having 6 to 12 carbon atoms, or aralkyl group having 7 to 12 carbon atoms.

In the above-mentioned $R^{13}$, illustrative example of the above-mentioned alkyl group includes a methyl group, an ethyl group, a propyl group, a butyl group, an amyl group, a cyclopentyl group, a cyclohexyl group, a norbornyl group, and an admantyl group. Illustrative example of the halogenated alkyl group includes a trifluoromethyl group, a 1,1,1-trifluoroethyl group, a 1,1,1-trichloroethyl group, and a nonafluorobutyl group. Illustrative of the aryl group includes a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative example of the halogenated aryl group includes a fluorophenyl group, a chlorophenyl group, and a 1,2,3,4,5-pentafluorophenyl group. Illustrative example of the aralkyl group includes a benzyl group and a phenethyl group.

Specific example of the photosensitive acid generator includes onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluolobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane; glyoxime derivatives such as bis-o-(p-toluenesulfonyl)-α-dimethyl glyoxime, bis-o-(p-toluenesulfonyl)-α-diphenyl glyoxime, bis-o-(p-toluenesulfonyl)-α-dicyclohexyl glyoxime, bis-o-(p-toluenesulfonyl)-2,3-pentanedione glyoxime, bis-(p-toluenesulfonyl)-2-methyl-3,4-pentanedione glyoxime, bis-o-(n-butanesulfonyl)-α-dimethyl glyoxime, bis-o-(n-butanesulfonyl)-α-diphenyl glyoxime, bis-o-(n-butanesulfonyl)-α-dicyclohexyl glyoxime, bis-o-(n-butanesulfonyl)-2,3-pentanedione glyoxime, bis-o-(n-butanesulfonyl)-2-methyl-3,4-pentanedione glyoxime, bis-o-(methanesulfonyl)-α-dimethyl glyoxime, bis-o-(trifluoromethanesulfonyl)-α-dimethyl glyoxime, bis-o-(1,1,1-trifluoroethanesulfonyl)-α-dimethyl glyoxime, bis-o-(tert-butanesulfonyl)-α-dimethyl glyoxime, bis-o-(perfluorooctanesulfonyl)-α-dimethyl glyoxime, bis-o-(cyclohexanesulfonyl)-α-dimethyl glyoxime, bis-o-(benzenesulfonyl)-α-dimethyl glyoxime, bis-o-(p-fluorobenzenesulfonyl)-α-dimethyl glyoxime, bis-o-(p-tert-butylbenzenesulfonyl)-α-dimethyl glyoxime, bis-o-(xylenesulfonyl)-α-dimethyl glyoxime, and bis-o-(camphersulfonyl)-α-dimethyl glyoxime; oxime sulfonate derivatives such as α-(benzenesulfoniumoxyimino)-4-methylphenylacetonitrile; β-keto sulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; imide-yl-sulfonate derivatives such as phthalimide-yl-triflate, phthalimide-yl-tosylate, 5-norbornene 2,3-dicarboxyimide-yl-triflate, 5-norbornene 2,3-dicarboxyimide-yl-tosylate, 5-norbornene 2,3-dicarboxyimide-yl-n-butylsulfonate, and n-trifluoromethylsulfonyloxy naphthylimide; iminosulfonates such as (5-(4-methylphenyl)sulfonyloxyimino-5H-thiophene-2-ylidene)-(2-methylphenyl)acetonitrile and (5-(4-methylphenylsulfonyloxy)phenylsulfonyloxyimino-5H-thiophene-2-ylidene)-(2-methylphenyl)acetonitrile; and 2-methyl-2[(4-methylphenyl)sulfonyl]-1-[(4-methylthio)phenyl]-1-propane. Among them, imide-yl-sulfonates, iminosulfonates, and oximesulfonates are preferably used.

Meanwhile, these photosensitive acid generators may be used solely or two or more of them.

In view of the light absorption of the photosensitive acid generator itself and photo-curability in a thick film, amount of the photosensitive acid generator to be blended is preferably in the range of 0.05 to 20 parts by mass, or especially preferably in the range of 0.2 to 5 parts by mass, relative to 100 parts by mass of (A) the polymer compound.

As to (D) the solvent, a solvent in which (A) the polymer compound, (B) the crosslinking agent, and (C) the photosensitive acid generator can be dissolved may be used.

Illustrative example of the solvent like this includes ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and here, one or two or more of them may be used. Among them, ethyl lactate, cyclohexanone, cyclopentanone, propylene glycol monomethyl ether acetate, and γ-butyrolactone, or a mixture of them are especially preferable, because these have the utmost solubility of the photosensitive acid generator.

In view of compatibility, viscosity coefficient, and coating properties of the resist composition, amount of the solvent mentioned above to be blended is preferably in the range of 50 to 2,000 parts by mass, or especially preferably in the range of 100 to 1,000 parts by mass, relative to 100 parts by mass of the total of (A) the polymer compound, (B) the crosslinking agent, and (C) the photosensitive acid generator.

Moreover, in the chemically amplified negative resist composition of the present invention, (E) a basic compound may be added if necessary. As the basic compound, a compound capable of suppressing diffusion rate of an acid that is generated from the photosensitive acid generator in the resist film is suitable. By blending the basic compound like this, the resolution power may be enhanced, the sensitivity change after exposure may be suppressed, and dependence on a substrate and an environment can be made small, so that the exposure allowance, the pattern shape, and the like may be improved.

The basic compound like this may be exemplified by primary, secondary, and tertiary aliphatic amines, mixed amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an nitrogen-containing alcoholic compound, an amide derivative, an imide derivative, a compound shown by the following general formula (20), and the like.

$$N(\alpha)_q(\beta)_{3-q} \tag{20}$$

wherein "q" is 1, 2, or 3. The side chain α represents the same or different substituent group shown by any of the following general formulae (21) to (23). The side chain β represents the same or different hydrogen atom, or linear, branched, or cyclic alkyl group having 1 to 20 carbon atoms which may optionally contain an ether bond or a hydroxyl group. Further, the side chains a may be bonded with each other to form a ring,

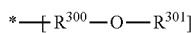  (21)

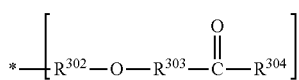  (22)

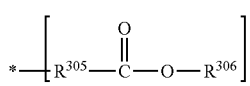  (23)

Here, $R^{300}$, $R^{302}$, and $R^{305}$ represent a linear or a branched alkylene group having 1 to 4 carbon atoms; and $R^{301}$ and $R^{304}$ represent a hydrogen atom, or a linear, a branched, or a cyclic alkyl group having 1 to 20 carbon atoms which may optionally contain one or a plurality of a hydroxyl group, an ether bond, an ester bond, and a lactone ring. $R^{303}$ represents a single bond, or a liner or a branched alkylene group having 1 to 4 carbon atoms; and $R^{306}$ represents a linear, a branched, or a cyclic alkyl group having 1 to 20 carbon atoms which may optionally contain one or a plurality of a hydroxyl group, an ether bond, an ester bond, and a lactone ring. Meanwhile, the symbol * shows the bond terminal.

Illustrative example of the primary aliphatic amines includes ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Illustrative example of the secondary aliphatic amines includes dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine.

Illustrative example of the tertiary aliphatic amines includes trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, N,N,N',N'-tetramethylethylene diamine, and N,N,N',N'-tetramethyltetraethylene pentamine.

The mixed amines may be exemplified by dimethylethylamine, methylethylpropylamine, benzylamine, phenethylamine, benzyldimethylamine, and the like.

Illustrative example of the aromatic amines and the heterocyclic amines includes aniline derivatives (such as, for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (such as, for example, pyrrole, 2H-pyrrole, 1-methylpyrrole, 2,4-dimethylpyrrole, 2,5-dimethylpyrrole, and N-methylpyrrole), oxazole derivatives (such as, for example, oxazole and isooxazole), thiazole derivatives (such as, for example, thiazole and isothiazole), imidazole derivatives (such as, for example, imidazole, 4-methylimidazole, and 4-methyl-2-phenylimidazole), a pyrazole derivative, a furazan derivative, pyrroline derivatives (such as pyrroline and 2-methyl-1-pyrroline), pyrrolidine derivatives (such as, for example, pyrrolidine, N-methylpyrrolidine, pyrrolidinone, and N-methylpyrrolidone), an imidazoline derivative, an imidazolidine derivative, pyridine derivatives (such as, for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), a pyridazine derivative, a pyrimidine derivative, a pyrazine derivative, a pirazoline derivative, a pyrazolidine derivative, a piperidine derivative, a piperazine derivative, a morpholine derivative, an indole derivative, an isoindole derivative, a 1H-indazole derivative, an indoline derivative, quinoline derivatives (such as, for example, quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

Illustrative example of the nitrogen-containing compound having a carboxyl group includes amino benzoic acid, indole carboxylic acid, and amino acid derivatives (such as, for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine).

Illustrative example of the nitrogen-containing compound having a sulfonyl group includes 3-pyridinesulfonic acid and pyridinium p-toluenesulfonate.

Illustrative example of the nitrogen-containing compound having a hydroxyl group, the nitrogen-containing compound having a hydroxyphenyl group, and the nitrogen-containing alcoholic compound includes 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotine amide.

Illustrative example of the amide derivative includes formamide, N-methyl formamide, N,N-dimethyl formamide, acetamide, N-methyl acetamide, N,N-dimethyl acetamide, propione amide, and benzamide.

Illustrative example of the imide derivative includes phthalimide, succinimide, and maleimide.

Illustrative example of the compound shown by the general formula (20) includes tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1- ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl) 2-(acetoxyacetoxy)ethyl amine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl) 2-(methoxycarbonyl)ethyl amine, N,N-bis(2-acetoxyethyl) 2-(methoxycarbonyl)ethyl amine, N,N-bis(2-hydroxyethyl) 2-(ethoxycarbonyl)ethyl amine, N,N-bis(2-acetoxyethyl) 2-(ethoxycarbonyl)ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl)ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofuran-3-yl)oxycarbonyl]ethyl amine, N,N-bis(2-acetoxyethyl) 2-[(2-oxotetrahydrofuran-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl)ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butyl bis[2-(methoxycarbonyl)ethyl]amine, N-butyl bis[2-(2-methoxyethoxycarbonyl)ethyl]amine, N-methyl bis(2-acetoxyethyl)amine, N-ethyl bis(2-acetoxyethyl)amine, N-methyl bis(2-pivaloyloxyethyl)amine, N-ethyl bis[2-(methoxycarbonyloxy)ethyl]amine, N-ethyl bis[2-(tert-butoxycarbonyloxy)ethyl]amine, tris(methoxycarbonylmethyl)amine, tris(ethoxycarbonylmethyl)amine, N-butyl bis(methoxycarbonylmethyl)amine, N-hexyl bis(methoxycarbonylmethyl)amine, and β-(diethylamino)-δ-valerolactone; however, the compound is not restricted to them.

The basic compounds as mentioned above may be used solely or as a mixture of two or more of them.

Amount of the basic compound to be blended is, in view of the sensitivity thereof, preferably in the range of 0 to 3 parts by mass, or especially preferably in the range of 0.01 to 1 part by mass, relative to 100 parts by mass of (A) the polymer compound.

Besides the (A) to (E) components as mentioned above, in the chemically amplified negative resist composition of the present invention, an additive may be added. The additive component may be exemplified by a surfactant which is usually used to enhance coating properties, a light absorber which is usually used to enhance light absorption of the photosensitive acid generator or the like, and so forth.

As to the above-mentioned surfactant, a nonionic type is preferable; for example, a fluorinated surfactant may be mentioned for it. Specific example of the fluorinated surfactant includes a perfluoroalkyl polyoxyethylene ethanol, a fluorinated alkyl ester, a perfluoroalkyl amine oxide, and a fluorine-containing organosiloxane compound.

Those surfactants that are commercially available may be used; and illustrative example thereof includes Flolade "FC-4430" (manufactured by Sumitomo 3M Ltd.); Surflon "S-141" and "S-145" (both are manufactured by Asahi Glass Co., Ltd.); Unidyne "DS-401", "DS-4031", and "DS-451" (all are manufactured by Daikin Industries, Ltd.); Megafac "F-8151" (manufactured by DIC Corp.); and "X-70-093" (manufactured by Shin-Etsu Chemical Co., Ltd.). Among them, Flolade "FC-4430" (manufactured by Sumitomo 3M Ltd.) and "X-70-093" (manufactured by Shin-Etsu Chemical Co., Ltd.) are preferable.

The above-mentioned light-absorber may be exemplified by a diaryl sulfoxide, a diaryl sulfone, 9,10-dimethylanthracene, 9-fluorenone, and the like.

The chemically amplified negative resist composition of the present invention may be obtained by a usual method. After the afore-mentioned respective components are mixed by stirring, the resulting mixture is filtrated by a filter or the like to obtain the chemically amplified negative resist composition. A dry film which will be mentioned later may be obtained similarly by using this resist composition.

Patterning by using the chemically amplified negative resist composition of the present invention that is obtained in the way as mentioned above may be done by using a heretofore known lithography technology.

For example, the chemically amplified negative resist composition is applied by a spin coating method onto a silicon wafer, a $SiO_2$ substrate, a SiN substrate, or a substrate formed with a pattern of a copper wiring or the like; and then, it is prebaked in the temperature range of 80 to 130° C. and for the time range of 50 to 600 seconds to form a resist film having the thickness in the range of 1 to 50 μm, preferably in the range of 1 to 30 μm, or more preferably in the range of 5 to 20 μm.

In the spin coating method, after about 5 mL of the resist composition is dispensed on a silicon substrate, the substrate is rotated, whereby the resist composition may be applied onto the substrate. By controlling the rotation speed during this operation, film thickness of the resist film on the substrate may be readily controlled.

Next, a mask to form the intended pattern is put over the resist film, and then, a high energy beam having wavelength of 190 to 500 nm such as an i-beam and a g-beam is irradiated thereto with the exposure dose of about 1 to 5,000 $mJ/cm^2$, or preferably about 100 to 2,000 $mJ/cm^2$. By this exposure, the exposed part is crosslinked to form a pattern not soluble in a developer (this will be mentioned later).

Then, if necessary, post-exposure bake (PEB) may be carried out on a hot plate in the temperature range of 60 to 150° C. and for the time range of 1 to 10 minutes, or preferably in the temperature range of 80 to 120° C. and for the time range of 1 to 5 minutes.

Thereafter, development is carried out by using a developer. The preferable aqueous alkaline solution developer for the chemically amplified negative resist composition obtained by using the polymer compound of the present invention is the aqueous 2.38% tetramethyl ammonium hydroxide (TMAH) solution. Development may be done by a usual method, for example, by soaking the substrate formed with a pattern into the developer. Then, if necessary, washing, rinsing, drying, and so forth may be done to obtain a resist film having an intended pattern. Meanwhile, in the case that patterning is not necessary, that is, for example, in the case that a uniform film is merely wanted, the same procedure as the above-mentioned patterning process, but without using a photomask may be employed.

The obtained pattern is preferably post-cured by using an oven or a hot plate in the temperature range of 100 to 250° C., preferably in the range of 150 to 220° C., or more preferably in the range of 170 to 190° C. If the post-cure temperature is in the range of 100 to 250° C., the crosslinking density of the resist film may be increased and a remaining volatile component may be removed; and thus, this temperature range is preferable in view of adhesiveness to the substrate, heat resistance, strength, and electronic characteristics. The time for the post-cure may be made in the range of 10 minutes to 10 hours.

The cured film thus obtained has excellent flexibility, adhesiveness with the substrate, heat resistance, electric characteristics, mechanical strength, and chemical resistance to a soldering flux liquid; and thus, a semiconductor device having the cured film like this as the top coat film has superior reliability, whereby especially generation of a crack during a thermal cycle test can be prevented from occurring. In other words, the chemically amplified negative resist composition of the present invention can be a top coat film suitable to protect electric and electronic parts, a semiconductor device, and the like.

Moreover, the present invention provides a photo-curable dry film obtained by using the afore-mentioned chemically amplified negative resist composition.

At first, the structure of the photo-curable dry film of the present invention will be explained. The photo-curable dry film has a structure that a photo-curable resin layer is sandwiched between a supporting film and a top coat film; and in the photo-curable resin layer, the chemically amplified negative resist composition of the present invention which is effective to form the top coat film to protect electric and electronic parts may be used. The photo-curable dry film like this can form a fine pattern in wide ranges of film thickness and wavelength; and by the low temperature post-cure, this can become a cured film having excellent flexibility, heat resistance, electric characteristics, adhesiveness, reliability, and chemical resistance.

In the present invention, the photo-curable resin layer of the photo-curable dry film that is obtained by the above-mentioned resist composition is a solid, so that the photo-curable resin layer does not contain a solvent; and thus, there is no fear due to evaporation thereof that an air void remains inside the photo-curable resin layer as well as between it and the substrate having a concavity and a convexity.

The interlayer insulating film is tending to become thinner as a semiconductor device is moving towards downsizing, thinning, and increasing layers; and in view of flatness of the substrate having a concavity and a convexity and covering of the uneven surface, film thickness of the photo-curable resin layer is preferably in the range of 10 to 100 μm, more preferably in the range of 10 to 70 μm, or especially preferably in the range of 10 to 50 μm.

In the photo-curable resin layer, the viscosity coefficient and the fluidity are closely interrelated; and thus, the photo-curable resin layer can express a proper fluidity in a proper range of the viscosity coefficient, so that it can penetrate deep into a narrow space. Accordingly, in the photo-curable dry film having the photo-curable resin layer formed by the chemically amplified negative resist composition which contains the polymer compound of the present invention having a proper viscosity coefficient as mentioned above, the photo-curable resin layer can follow a concavity and a convexity of a substrate to cover them when adhering to the substrate having the concavity and the convexity, whereby achieving a high flatness. Moreover, the polymer compound of the present invention, which is a main component of the photo-curable resin layer, contains a siloxane chain; and because of this, the surface tension thereof is so low that a higher flatness may be achievable. In addition, if the photo-curable resin layer is adhered to the substrate under a vacuum environment, generation of the space therebetween can be more effectively prevented from occurring.

Next, the method for producing the photo-curable dry film of the present invention will be explained.

In the photo-curable dry film of the present invention, the chemically amplified negative resist composition used for forming the photo-curable resin layer is obtained by mixing the (A) to (D) components (if necessary, (E) component and so forth may be added) with stirring, which is followed by filtration through a filter or the like. This chemically amplified negative resist composition may be used as the material for forming the photo-curable resin layer.

The supporting film used in the photo-curable dry film of the present invention may be a monolayer or a multilayer film having plural polymer films laminated. The material of it may be exemplified by a synthetic resin film and so forth including polyethylene, polypropylene, polycarbonate, and polyethylene terephthalate, though polyethylene terephthalate is preferable because it has proper flexibility, mechanical strength, and heat resistance. These films may be treated variously such as, for example, with the corona treatment and with coating treatment by a releasing agent. Many commercially available goods may be used; and illustrative example thereof includes Cerapeel WZ (RX) and Cerapeel BX8 (R) (both are manufactured by Toray Advanced Film Co., Ltd.); E7302 and E7304 (both are manufactured by Toyobo Co., Ltd.); Purex G31 and Purex G71T1 (both are manufactured by Teijin DuPont Films Japan Ltd.); and PET38×1-A3, PET38×1-V8, and PET38×1-X08 (all manufactured by Nippa Co., Ltd.).

In the top coat film used in the photo-curable dry film of the present invention, the same film as the above-mentioned supporting film may be used; however, polyethylene terephthalate and polyethylene having proper flexibility are preferable. For this, commercially available goods may be used; and illustrative example thereof includes, besides the polyethylene terephthalates that have already been mentioned, GF-8 (manufactured by Tamapoly Co., Ltd.) and PE Film 0-Type (manufactured by Nippa Co., Ltd.) as polyethylene.

Thicknesses of the supporting film and the top coat film are preferably both in the range of 10 to 100 μm, or especially preferably in the range of 25 to 50 μm, in view of stable production of the photo-curable dry film and of the rolling habit to a roll axis, that is, in view of so-called curl-prevention.

As to the manufacturing equipment of the photo-curable dry film, a film coater that is generally used for an adhesive product may be used. Illustrative example of the film coater includes a comma coater, a comma reverse coater, a multi coater, a die coater, a lip coater, a lip reverse coater, a direct gravure coater, an offset gravure coater, a 3-roll bottom revere coater, and a 4-roll bottom reverse coater.

The supporting film is rolled-out from a roll-out axis of the film coater; and during the time when it is passing through a coater head of the film coater, the resist composition is applied onto the supporting film with a prescribed thickness to continuously form the photo-curable resin layer; and then, after it is passed through a hot-air circulating oven at a prescribed temperature and for a prescribed period, the photo-curable resin layer that has been continuously dried on the supporting film is passed together with the top coat film that has been rolled-out from a different roll-out axis of the film coater through a laminate roll under a prescribed pressure whereby adhering it with the photo-curable resin layer on the supporting film, which is then followed by roll-up to a roll-up axis of the film coater. In this case, temperature of the hot-air circulating oven is preferably in the range of 25 to 150° C., the period for passing through it is preferably in the range of 1 to 100 minutes, and the laminate roll pressure is preferably in the range of 0.01 to 5 MPa.

Next, the patterning process using the photo-curable dry film that is obtained in the way as mentioned above will be explained.

In the patterning process using the photo-curable dry film of the present invention, firstly the top coat film is removed from the photo-curable dry film, whereby adhering the photo-curable resin layer to the substrate. Next, the photo-exposure is done; and then, the post-exposure bake (hereinafter, PEB) is carried out. Subsequently, development is done, and if necessary post-curing is done; thereby a cured film having the pattern thereon can be obtained.

Firstly, the photo-curable dry film is adhered to a substrate by using a film adhering equipment. The substrate may be exemplified by a silicon wafer, a silicon wafer for TSV, a plastics, a ceramics, a circuit substrate made of various metals, and the like; especially the substrate having a trench or a hole with the aperture width thereof in the range of 10 to 100 µm and the depth thereof in the range of 10 to 120 µm may be mentioned. As to the film adhering equipment, a vacuum laminator is preferable.

Firstly, the photo-curable dry film is attached to a film adhering equipment; and the photo-curable resin layer that becomes exposed by removing the top coat film of the photo-curable dry film is adhered to a substrate on a table with a prescribed temperature by using an adhering roll under a prescribed pressure in a vacuum chamber with a prescribed evacuation degree. Meanwhile, temperature of the table is preferably in the range of 60 to 120° C.; pressure of the adhering roll is preferably in the range of 0 to 5.0 MPa; and evacuation degree of the vacuum chamber is preferably in the range of 50 to 500 Pa.

After adhesion, patterning may be done by using a heretofore known lithography technology. At this time, in order to effectively carry out the photo-curing reaction of the photo-curable resin layer as well as to enhance the adhesiveness between the photo-curable resin layer and the substrate, a pre-bake may be carried out if necessary. The pre-bake may be done, for example, in the temperature range of 40 to 140° C. and for the period in the range of about 1 minute to about 1 hour.

Next, the curing is carried out by exposure to a light having a wavelength of 190 to 500 nm via a photomask under the state of intervention of the supporting film or under the state of the supporting film delaminated. The photomask, for example, having a prescribed pattern engraved may be used as well. Meanwhile, the photomask is made of preferably a material that can shield the light having a wavelength of 190 to 500 nm; and thus, for example, chromium and the like are preferably used, though not limited to them.

As to the light having a wavelength of 190 to 500 nm, lights having various wavelengths generated from, for example, a radiation-beam generating instrument may be used; and thus, illustrative example thereof includes UV lights such as a g-beam and an i-beam, and far ultraviolet lights (248 nm and 193 nm). The wavelength is preferably in the range of 248 to 436 nm. The exposure dose is preferably, for example, in the range of 10 to 3,000 mJ/cm$^2$. By doing the exposure like this, the exposed part is crosslinked to form the pattern not soluble in the developer (this will be mentioned later).

Then, in order to enhance the development sensitivity, the post-exposure baking (PEB) is carried out. The post-exposure baking is done, for example, in the temperature range of 40 to 140° C. and for the period in the range of 0.5 to 10 minutes.

Thereafter, development is carried out by using a developer. A preferable aqueous alkaline solution for the chemically amplified negative resist composition obtained by using the polymer compound of the present invention is an aqueous 2.38% tetramethyl ammonium hydroxide (TMAH) solution. Development may be done by a usual method, for example, by soaking the substrate formed with a pattern into a developer. Then, if necessary, washing, rinsing, drying, and so forth may be done to obtain a film of the photo-curable resin layer having an intended pattern. Meanwhile, in the case that patterning is not necessary, that is, for example, in the case that a mere uniform film is wanted, the same procedure as the above-mentioned patterning process but without using a photomask may be employed.

The obtained pattern is preferably post-cured by using an oven or a hot plate in the temperature range of 100 to 250° C., preferably in the range of 150 to 220° C., or more preferably in the range of 170 to 190° C. If the post-cure is carried out in the temperature range of 100 to 250° C., the crosslinking density of the curable resin layer film may be increased and a remaining volatile component may be removed; and thus, this temperature range is preferable in view of adhesion to the substrate, heat resistance, strength, and electronic characteristics. The time for the post-cure may be made in the range of 10 minutes to 10 hours.

The cured film thus obtained has excellent flexibility, adhesiveness with the substrate, heat resistance, electric characteristics, mechanical strength, and chemical resistance to a soldering flux liquid; and thus, a semiconductor device having the cured film like this as the top coat film has superior reliability; especially, generation of a crack during a thermal cycle test can be prevented from occurring. In other words, the photo-curable dry film of the present invention can be a top coat film suitable to protect electric and electronic parts, a semiconductor device, and the like.

The photo-curable dry film of the present invention can be effectively applied to the substrate having a trench or a hole as mentioned above; and thus, the present invention provides a layered product which has the cured layer of the photo-curable resin formed of the photo-curable dry film on the substrate having a trench and/or a hole with an aperture width thereof in the range of 10 to 100 µm and the depth thereof in the range of 10 to 120 µm.

As mentioned above, the chemically amplified negative resist composition of the present invention and the photo-curable dry film produced by using this composition can become by curing a top coat film having excellent flexibility, adhesiveness, heat resistance, electric characteristics, mechanical strength, and chemical resistance; and thus, these are useful for adhesion to a substrate as well as for an insulating film of a semiconductor device including a rewiring use, an insulating film for a multilayer printed substrate, a solder mask, a cover lay film, and a through-silicon via (TSV).

EXAMPLES

Hereunder, the present invention will be explained specifically by showing Synthesis Examples and Examples; however, the present invention is not limited by the following Synthesis Examples and Examples. Meanwhile, in the following Synthesis Examples and Examples, the term "parts" shows parts by mass.

[Synthesis of Polymer Compound]

In Synthesis Examples 1 to 10 shown below, the polymer compounds (A-1 to A-10) of the present invention were synthesized. Meanwhile, structures of the Compounds 1 to 7 used in Synthesis Examples 1 to 10 are shown below.

Compound 1
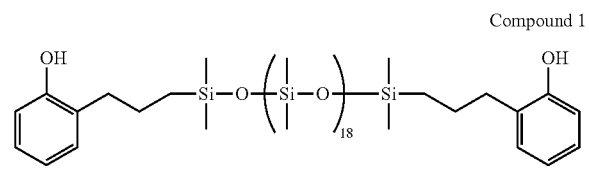

Compound 2
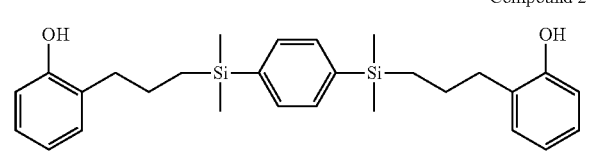

Compound 3
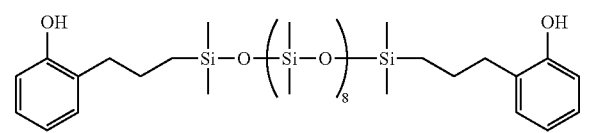

Compound 4
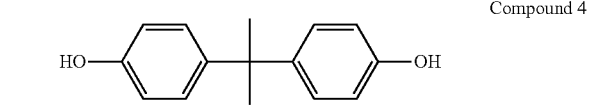

Compound 5
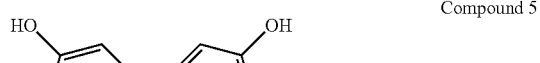

Compound 6
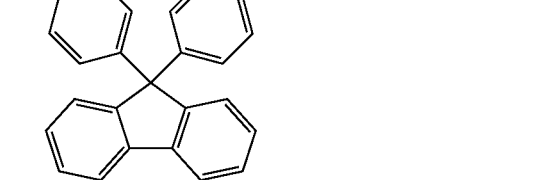

Compound 7
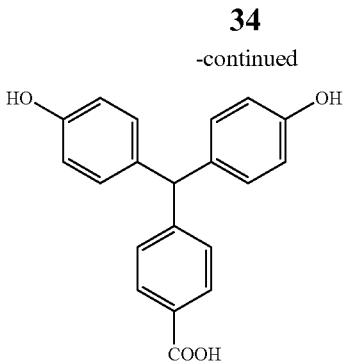

Synthesis Example 1

Into a three-necked 300 mL flask inside which was replaced with nitrogen were weighed 50 g (28.8 mmol) of Compound 1, 13.3 g (28.8 mmol) of Compound 2, 8.6 g (57.6 mmol) of terephthalaldehydic acid, 50 g of dichloroethane, and 13 g of toluene; and then, the flask was heated to 75° C. Thereafter, 3.6 g (31.2 mmol) of methanesulfonic acid was gradually added into it; and then, the resulting mixture was aged at 80° C. for 17 hours. After cooled to room temperature, 150 g of 4-methyl-2-pentanone was added to the mixture. This mixture was transferred to a 1 L separatory funnel; and then, after washed with 150 g of ultrapure water for 4 times, the organic layer was distilled out under reduced pressure and then added with 150 g of cyclopentanone to obtain Polymer Compound (A-1) in the solvent mainly comprising cyclopentanone with the solid concentration of 50 to 60% by mass.

The molecular weight of this polymer compound was measured by GPC to obtain the polystyrene-equivalent weight average molecular weight of 5,000; and it was found from the $^1$HNMR spectroscopic analysis that each component was incorporated into the polymer. It was found that in the general formula (12), d=0.25, e=0, f=0.25, g=0.5, and h=0.

Synthesis Example 2

Into a three-necked 300 mL flask inside which was replaced with nitrogen were weighed 50 g (28.8 mmol) of Compound 1, 13.3 g (28.8 mmol) of Compound 2, 8.6 g (57.6 mmol) of terephthalaldehydic acid, 50 g of dichloroethane, and 13 g of toluene; and then, the flask was heated to 75° C. Thereafter, 3.6 g (31.2 mmol) of methanesulfonic acid was gradually added into it; and then, the resulting mixture was aged at 80° C. for 17 hours. After cooled to 75° C. again, 0.46 g (5.8 mmol) of an aqueous 37% formaldehyde solution was added to it; and then, this mixture solution was aged for 3 hours. After cooled to room temperature, 150 g of 4-methyl-2-pentanone was added to this mixture. This mixture was transferred to a 1 L separatory funnel; and then, after washed with 150 g of ultrapure water for 4 times, the organic layer was distilled out under reduced pressure and then added with 150 g of cyclopentanone to obtain Polymer Compound (A-2) in the solvent mainly comprising cyclopentanone with the solid concentration of 50 to 60% by mass.

The molecular weight of this polymer compound was measured by GPC to obtain the polystyrene-equivalent weight average molecular weight of 13,500; and it was found from the $^1$HNMR spectroscopic analysis that each component was incorporated into the polymer. It was found that in the general formula (12), d=0.24, e=0, f=0.24, g=0.47, and h=0.05.

Synthesis Example 3

Synthesis procedure of Synthesis Example 2 was repeated, except that amount of the aqueous 37% formaldehyde solution was changed to 0.82 g (10.0 mmol), to obtain Polymer Compound (A-3).

The molecular weight of this polymer compound was measured by GPC to obtain the polystyrene-equivalent weight average molecular weight of 42,200; and it was found from the $^1$HNMR spectroscopic analysis that each component was incorporated into the polymer. It was found that in the general formula (12), d=0.23, e=0, f=0.23, g=0.46, and h=0.08.

Synthesis Example 4

Synthesis procedure of Synthesis Example 3 was repeated, except that 28.7 g (28.8 mmol) of Compound 3 was used in place of Compound 1, to obtain Polymer Compound (A-4).

The molecular weight of this polymer compound was measured by GPC to obtain the polystyrene-equivalent weight average molecular weight of 21,000; and it was found from the $^1$HNMR spectroscopic analysis that each component was incorporated into the polymer. It was found that in the general formula (12), d=0.23, e=0, f=0.23, g=0.46, and h=0.08.

Synthesis Example 5

Into a three-necked 300 mL flask inside which was replaced with nitrogen were weighed 50 g (28.8 mmol) of Compound 1, 13.3 g (28.8 mmol) of Compound 2, 6.8 g (45.2 mmol) of terephthalaldehydic acid, 1.3 g (12.3 mmol) of benzaldehyde, 50 g of dichloroethane, and 13 g of toluene; and then, the flask was heated to 75° C. Thereafter, 3.6 g (31.2 mmol) of methanesulfonic acid was gradually added into it; and then, the resulting mixture was aged at 80° C. for 17 hours. After cooled to 75° C. again, 0.82 g (10.0 mmol) of an aqueous 37% formaldehyde solution was added to it; and then, this mixture solution was aged for 3 hours. After cooled to room temperature, 150 g of 4-methyl-2-pentanone was added to this mixture. This mixture was transferred to a 1 L separatory funnel; and then, after washed with 150 g of ultrapure water for 4 times, the organic layer was distilled out under reduced pressure and then added with 150 g of cyclopentanone to obtain Polymer Compound (A-5) in the solvent mainly comprising cyclopentanone with the solid concentration of 50 to 60% by mass.

The molecular weight of this polymer compound was measured by GPC to obtain the polystyrene-equivalent weight average molecular weight of 20,200; and it was found from the $^1$HNMR spectroscopic analysis that each component was incorporated into the polymer. It was found that in the general formula (15), d=0.23, f=0.23, g=0.36, h1=0.10, and h2=0.08.

Synthesis Example 6

Into a three-necked 300 mL flask inside which was replaced with nitrogen were weighed 50 g (28.8 mmol) of Compound 1, 6.6 g (28.8 mmol) of Compound 4, 8.6 g (57.6 mmol) of terephthalaldehydic acid, 50 g of dichloroethane, and 13 g of toluene; and then, the flask was heated to 75° C. Thereafter, 3.6 g (31.2 mmol) of methanesulfonic acid was gradually added into it; and then, the resulting mixture was aged at 80° C. for 17 hours. After cooled to 75° C. again, 0.82 g (10.0 mmol) of an aqueous 37% formaldehyde solution was added to it; and then, this mixture solution was aged for 3 hours. After cooled to room temperature, 150 g of 4-methyl-2-pentanone was added to this mixture. This mixture was transferred to a 1 L reparatory funnel; and then, after washed with 150 g of ultrapure water for 4 times, the organic layer was distilled out under reduced pressure and then added with 150 g of cyclopentanone to obtain Polymer Compound (A-6) in the solvent mainly comprising cyclopentanone with the solid concentration of 50 to 60% by mass.

The molecular weight of this polymer compound was measured by GPC to obtain the polystyrene-equivalent weight average molecular weight of 35,000; and it was found from the $^1$HNMR spectroscopic analysis that each component was incorporated into the polymer. It was found that in the general formula (12), d=0.23, e=0, f=0.23, g=0.46, and h=0.08.

Synthesis Example 7

Synthesis procedure of Synthesis Example 6 was repeated, except that 10.1 g (28.8 mmol) of Compound 5 was used in place of Compound 4, to obtain Polymer Compound (A-7).

The molecular weight of this polymer compound was measured by GPC to obtain the polystyrene-equivalent weight average molecular weight of 40,000; and it was found from the $^1$HNMR spectroscopic analysis that each component was incorporated into the polymer. It was found that in the general formula (12), d=0.23, e=0, f=0.23, g=0.46, and h=0.08.

Synthesis Example 8

Into a three-necked 300 mL flask inside which was replaced with nitrogen were weighed 80 g (46.0 mmol) of Compound 1, 3.3 g (11.5 mmol) of Compound 6, 8.6 g (57.6 mmol) of terephthalaldehydic acid, 50 g of dichloroethane, and 13 g of toluene; and then, the flask was heated to 75° C. Thereafter, 4.6 g (47.9 mmol) of methanesulfonic acid was gradually added into it; and then, the resulting mixture was aged at 80° C. for 17 hours. After cooled to 75° C. again, 0.75 g (9.2 mmol) of an aqueous 37% formaldehyde solution was added to it; and then, this mixture solution was aged for 3 hours. After cooled to room temperature, 150 g of 4-methyl-2-pentanone was added to this mixture. This mixture was transferred to a 1 L separatory funnel; and then, after washed with 150 g of ultrapure water for 4 times, the organic layer was distilled out under reduced pressure and then added with 150 g of cyclopentanone to obtain Polymer Compound (A-8) in the solvent mainly comprising cyclopentanone with the solid concentration of 50 to 60% by mass.

The molecular weight of this polymer compound was measured by GPC to obtain the polystyrene-equivalent weight average molecular weight of 36,000; and it was found from the $^1$HNMR spectroscopic analysis that each component was incorporated into the polymer. It was found that in the general formula (12), d=0.37, e=0.09, f=0, g=0.46, and h=0.08.

Synthesis Example 9

Synthesis procedure of Synthesis Example 8 was repeated, except that 1.7 g (28.8 mmol) of 4-hydroxyphenylacetic acid was used in place of Compound 6, to obtain Polymer Compound (A-9).

The molecular weight of this polymer compound was measured by GPC to obtain the polystyrene-equivalent weight average molecular weight of 35,000; and it was found from the $^1$HNMR spectroscopic analysis that each component was incorporated into the polymer. It was found that in the general formula (12), d=0.37, e=0.09, f=0, g=0.46, and h=0.08.

Synthesis Example 10

Synthesis procedure of Synthesis Example 8 was repeated, except that 3.7 g (28.8 mmol) of Compound 7 was used in place of Compound 6, to obtain Polymer Compound (A-10).

The molecular weight of this polymer compound was measured by GPC to obtain the polystyrene-equivalent weight average molecular weight of 41,000; and it was found from the $^1$HNMR spectroscopic analysis that each component was incorporated into the polymer. It was found that in the general formula (12), d=0.37, e=0.09, f=0, g=0.46, and h=0.08.

Preparation of Chemically Amplified Negative Resist Compositions

Examples 1 to 10

Polymer Compounds (A-1 to A-10) synthesized by the above-mentioned Synthesis Examples 1 to 10 were used. Thus, each of Polymer Compounds was blended with a crosslinking agent, a photosensitive acid generator, a basic compound, and cyclopentanone as the additional solvent, with the composition and the blending ratio as shown in Table 1, to obtain a photo-curable resin composition with the resin-equivalent concentration of 45% by mass. Thereafter, the composition was stirred, mixed, dissolved, and then filtrated through a 0.5 μm filter made of Teflon (registered trade mark) for microfiltration to obtain respective chemically amplified negative resist compositions 1 to 10 (Resist Compositions 1 to 10) formed of the respective photo-curable resin compositions.

TABLE 1

|  | Polymer Compound | Photo-sensitive acid generator | Cross-linking agent | Basic compound |
|---|---|---|---|---|
| Resist Composition 1 | A-1 (100 parts by mass) | PAG-1 (0.5 parts by mass) | XL-1 (7 parts by mass) | amine-1 (0.5 parts by mass) |
| Resist Composition 2 | A-2 (100 parts by mass) | PAG-1 (0.5 parts by mass) | XL-1 (7 parts by mass) | amine-1 (0.5 parts by mass) |
| Resist Composition 3 | A-3 (100 parts by mass) | PAG-1 (0.5 parts by mass) | XL-1 (7 parts by mass) | amine-1 (0.5 parts by mass) |
| Resist Composition 4 | A-4 (100 parts by mass) | PAG-1 (0.5 parts by mass) | XL-1 (7 parts by mass) | amine-1 (0.5 parts by mass) |
| Resist Composition 5 | A-5 (100 parts by mass) | PAG-1 (0.5 parts by mass) | XL-1 (7 parts by mass) | amine-1 (0.5 parts by mass) |
| Resist Composition 6 | A-6 (100 parts by mass) | PAG-1 (0.5 parts by mass) | XL-1 (7 parts by mass) | amine-1 (0.5 parts by mass) |
| Resist Composition 7 | A-7 (100 parts by mass) | PAG-1 (0.5 parts by mass) | XL-1 (7 parts by mass) | amine-1 (0.5 parts by mass) |
| Resist Composition 8 | A-8 (100 parts by mass) | PAG-1 (0.5 parts by mass) | XL-1 (7 parts by mass) | amine-1 (0.5 parts by mass) |
| Resist Composition 9 | A-9 (100 parts by mass) | PAG-1 (0.5 parts by mass) | XL-1 (7 parts by mass) | amine-1 (0.5 parts by mass) |
| Resist Composition 10 | A-10 (100 parts by mass) | PAG-1 (0.5 parts by mass) | XL-1 (7 parts by mass) | amine-1 (0.5 parts by mass) |

Meanwhile, structures of the photosensitive acid generator (PAG-1), the crosslinking agent (XL-1), and the basic compound (amine-1) described in Table 1 are as shown below.

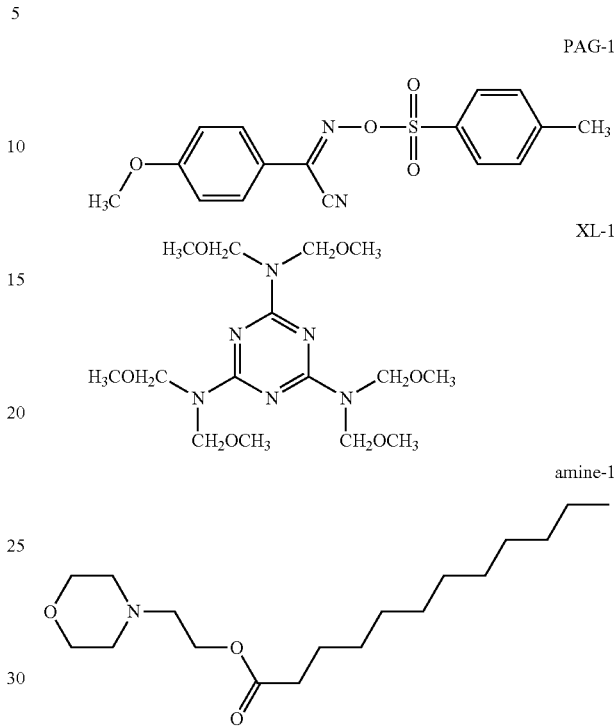

[Coating by a Spin Coating Method, Exposure, and Patterning]

Each (5 mL) of the Resist Compositions 1 to 10 obtained by the way as shown above was dispensed on a silicon substrate, and then coated by a spin coating method so as to give a film thickness of 20 μm. Then, the pre-baking thereof was carried out on a hot plate at 100° C. for 2 minutes.

Then, this substrate was mounted with a mask capable of forming 20 μm holes arranged in 1:1 lengthwise and breadthwise, and was exposed to a broad band light by using Mask Aligner MA-8 (manufactured by SUSS Micro Tec AG). After the exposure, the substrate was heated (PEB) at 110° C. for 2 minutes, and then cooled. Thereafter, patterning was carried out by repeating the one-minute puddle development for 3 times by using the aqueous 2.38% tetramethyl ammonium hydroxide (hereafter, referred to as TMAH) as a developer. Then, the pattern on the substrate was post-cured by using an oven whose temperature was controlled at 180° C. for 2 hours while purging therein with nitrogen.

In a similar manner, patternings were done on the SiN substrate and on the Cu substrate in place of the silicon substrate by using respective Resist Compositions 1 to 10 obtained by the ways as mentioned above.

Next, each of the substrates was cut-out so that shape of the obtained hole pattern might be observed; and shape of the hole pattern was observed by using a scanning electron microscope (SEM). The optimum exposure dose (converted to the 365 nm light exposure dose) to give the aperture diameter of the hole pattern the same size as the mask size of 20 μm is shown in Table 2. The observed shape is also shown in Table 2.

TABLE 2

| | Resist Composition | Exposure dose on silicon substrate (mJ) | Exposure dose on SiN substrate (mJ) | Exposure dose on Cu substrate (mJ) |
|---|---|---|---|---|
| Example 1 | Resist Composition 1 | Forward tapered 210 | Forward tapered 210 | Forward tapered 240 |
| Example 2 | Resist Composition 2 | Forward tapered 200 | Forward tapered 220 | Forward tapered 220 |
| Example 3 | Resist Composition 3 | Forward tapered 220 | Forward tapered 220 | Forward tapered 250 |
| Example 4 | Resist Composition 4 | Forward tapered 220 | Forward tapered 220 | Forward tapered 250 |
| Example 5 | Resist Composition 5 | Forward tapered 250 | Forward tapered 260 | Forward tapered 270 |
| Example 6 | Resist Composition 6 | Forward tapered 200 | Forward tapered 220 | Forward tapered 220 |
| Example 7 | Resist Composition 7 | Forward tapered 220 | Forward tapered 220 | Forward tapered 250 |
| Example 8 | Resist Composition 8 | Forward tapered 220 | Forward tapered 220 | Forward tapered 220 |
| Example 9 | Resist Composition 9 | Forward tapered 220 | Forward tapered 220 | Forward tapered 250 |
| Example 10 | Resist Composition 10 | Forward tapered 220 | Forward tapered 220 | Forward tapered 250 |

As shown in Table 2, Resist Compositions 1 to 10 which contained Polymer Compounds (A-1 to A-10) of the present invention could form patterns by using the aqueous 2.38% TMAH solution as a developer. Moreover, the pattern profiles of Resist Compositions 1 to 10 were forward tapered, that is, very good pattern shapes could be obtained. Delamination did not occur even in the substrates such as SiN substrate and Cu substrate, which undergo delamination readily during development.

Preparation of Photo-Curable Dry Films

Examples 11 to 20

By the same procedure as the afore-mentioned but without using the additional cyclopentanone; each Polymer Compounds (A-1 to A-10) synthesized by the above-mentioned Synthesis Examples 1 to 10 was blended with a crosslinking agent, a photosensitive acid generator, and a basic compound, with the composition and the blending ratio as shown in Table 1, to obtain a photo-curable resin composition. Thereafter, they were stirred, mixed, dissolved, and then filtrated through a 1.0 μm filter made of Teflon (registered trade mark) for microfiltration to obtain respective Resist Compositions 1' to 10' for photo-curable dry films.

By using a die coater as the film coater and a polyethylene terephthalate film (thickness of 38 μm) as the supporting film, Resist Compositions 1' to 10' were respectively applied onto the supporting film with the thickness of 50 μm. Then, it was passed through a hot-air circulating oven (length of 4 m) controlled at 100° C. with the passage time of 5 minutes to form a photo-curable resin layer on the supporting film. Thereafter, the polyethylene film (thickness of 50 μm) was adhered as the top coat film onto the photo-curable resin layer by using a laminate roll with the pressure of 1 MPa to obtain the Photo-curable dry films 1 to 10.

[Adhesion of Photo-Curable Dry Films, Exposure, and Patterning]

The top coat film of respective Photo-curable dry films 1 to 10 obtained in the way as mentioned above was removed; and then, the photo-curable resin layer on the supporting film was adhered onto a silicon substrate by using the vacuum laminator TEAM-100RF (manufactured by Takatori Corp.) while setting inside the vacuum chamber at the evacuation degree of 100 Pa and the temperature of 100° C. After the pressure was resumed to a normal pressure, the substrate was cooled to 25° C., taken out from the vacuum laminator, and then, the supporting film was removed. After removal of the supporting film, the pre-baking thereof was carried out on a hot plate at 100° C. for 5 minutes.

Then, this substrate was mounted with a mask capable of forming 40 μm holes arranged in 1:1 lengthwise and breadthwise, and was exposed to a broad band light by using Mask Aligner MA-8 (manufactured by SUSS Micro Tec AG). After the exposure, the substrate was heated (PEB) at 130° C. for 5 minutes, and then cooled. Thereafter, patterning was carried out by repeating the one-minute puddle development for 5 times by using the aqueous 2.38% TMAH solution as a developer. Then, the pattern on the substrate was post-cured by using an oven controlled at 180° C. for 2 hours while purging therein with nitrogen.

In a similar manner, patternings were done on the SiN substrate and on the Cu substrate in place of the silicon substrate by using respective photo-curable dry films 1 to 10 obtained by the ways as mentioned above.

Next, each of the substrates was cut-out so that shape of the obtained hole pattern might be observed; and shape of the hole pattern was observed by using a scanning electron microscope (SEM). The optimum exposure dose (converted to the 365 nm light exposure dose) to give the aperture diameter of the hole pattern the same size as the mask size of 40 μm is shown in Table 3. The observed shape is also shown in Table 3.

TABLE 3

| | Photo-curable dry film | Exposure dose on silicon substrate (mJ) | Exposure dose on SiN substrate (mJ) | Exposure dose on Cu substrate (mJ) |
|---|---|---|---|---|
| Example 11 | Photo-curable dry film 1 | Almost rectangular hole pattern 250 | Almost rectangular hole pattern 250 | Almost rectangular hole pattern 280 |
| Example 12 | Photo-curable dry film 2 | Almost rectangular hole pattern 240 | Almost rectangular hole pattern 260 | Almost rectangular hole pattern 260 |
| Example 13 | Photo-curable dry film 3 | Almost rectangular hole pattern 260 | Almost rectangular hole pattern 260 | Almost rectangular hole pattern 290 |
| Example 14 | Photo-curable dry film 4 | Almost rectangular hole pattern 260 | Almost rectangular hole pattern 260 | Almost rectangular hole pattern 290 |
| Example 15 | Photo-curable dry film 5 | Almost rectangular hole pattern 290 | Almost rectangular hole pattern 300 | Almost rectangular hole pattern 310 |
| Example 16 | Photo-curable dry film 6 | Almost rectangular hole pattern 240 | Almost rectangular hole pattern 260 | Almost rectangular hole pattern 260 |
| Example 17 | Photo-curable dry film 7 | Almost rectangular hole pattern 260 | Almost rectangular hole pattern 260 | Almost rectangular hole pattern 290 |
| Example 18 | Photo-curable dry film 8 | Almost rectangular hole pattern 260 | Almost rectangular hole pattern 260 | Almost rectangular hole pattern 260 |
| Example 19 | Photo-curable dry film 9 | Almost rectangular hole pattern 260 | Almost rectangular hole pattern 260 | Almost rectangular hole pattern 290 |

TABLE 3-continued

| | Photo-curable dry film | Exposure dose on silicon substrate (mJ) | Exposure dose on SiN substrate (mJ) | Exposure dose on Cu substrate (mJ) |
|---|---|---|---|---|
| Example 20 | Photo-curable dry film 10 | Almost rectangular hole pattern 260 | Almost rectangular hole pattern 260 | Almost rectangular hole pattern 290 |

As shown in Table 3, the photo-curable dry films using the photo-curable resin compositions which contained the polymer compounds of the present invention could form patterns by using the aqueous 2.38% TMAH solution as a developer. Moreover, the pattern profiles thereof were excellent; and delamination did not occur substantially even in the substrates such as SiN and Cu, which undergo delamination readily during development.

Fill-Up Performance Test of Photo-Curable Dry Films

Examples 21 to 25

A 6 inch silicon wafer having 200 circular holes, each having the aperture diameter of 10 to 100 μm (pitch of 10 μm) and the depth of 10 to 120 μm (pitch of 10 μm) was prepared as the substrate. Each of the top coat films of the respective afore-mentioned photo-curable dry films 1, 3, 4, 8, and 10 was removed; and then, the photo-curable resin layer on the supporting film was adhered onto the prepared substrate by using the vacuum laminator TEAM-100RF (manufactured by Takatori Corp.) while setting inside the vacuum chamber at the evacuation degree of 100 Pa and the temperature of 100° C. After the pressure was resumed to a normal pressure, the substrate was cooled to 25° C., taken out from the vacuum laminator, and then, the supporting film was removed. After removal of the supporting film, the pre-baking thereof was carried out on a hot plate at 100° C. for 5 minutes.

Then, the substrate was exposed to a broad band light with the exposure dose (365 nm wavelength) shown in Table 4 by using Mask Aligner MA-8 (manufactured by SUSS Micro Tec AG). After the exposure, the substrate was heated (PEB) at 110° C. for 5 minutes, and then cooled. Thereafter, the one-minute puddle development was repeated for 5 times by using the aqueous 2.38% TMAH solution as a developer. Then, the substrate was post-cured by using an oven whose temperature was controlled at 180° C. for 2 hours while purging therein with nitrogen.

Each of the substrates thus obtained was diced to expose the cross section of the circular holes; and the cross section of the circular holes was observed by using a scanning electron microscope (SEM) to evaluate the fill-up performance and whether or not a defect was present. These results are shown in Table 4.

TABLE 4

| | Photo-curable dry film | Exposure dose (mJ) | Observation result of circular hole cross section |
|---|---|---|---|
| Example 21 | Photo-curable dry film 1 | 250 | No defect excellent fill-up |
| Example 22 | Photo-curable dry film 3 | 250 | No defect excellent fill-up |
| Example 23 | Photo-curable dry film 4 | 250 | No defect excellent fill-up |
| Example 24 | Photo-curable dry film 8 | 250 | No defect excellent fill-up |
| Example 25 | Photo-curable dry film 10 | 250 | No defect excellent fill-up |

As shown in Table 4, all the circular holes of the silicon wafer having the photo-curable dry film of the present invention adhered thereto are filled up without a defect; and thus, the fill-up performance of the photo-curable dry film of the present invention as the top coat film to protect electric and electronic parts was excellent.

[Test of Electric Characteristics (Dielectric Breakdown Strength) of Photo-Curable Dry Films]

Each of the top coat film of the respective afore-mentioned photo-curable dry films 1, 3, 4, 8, and 10 was removed; and then, the photo-curable resin layer on the supporting film was adhered onto the substrate stipulated in JIS K 6249 at the temperature of 100° C. After the substrate was cooled to room temperature, the supporting film was removed. After removal of the supporting film, the pre-baking thereof was carried out on a hot plate at 100° C. for 5 minutes.

Then, the substrate was exposed to a broad band light with the exposure dose of 1,000 mJ/cm$^2$ (365 nm wavelength) by using the afore-mentioned mask aligner via a quartz photomask. After the exposure, the substrate was heated (PEB) at 110° C. for 5 minutes, and then cooled. Thereafter, the one-minute puddle development was repeated for 5 times by using the aqueous 2.38% TMAH solution as a developer. Then, post-cure was carried out by using an oven whose temperature was controlled at 180° C. for 2 hours while purging therein with nitrogen to obtain the substrate for measurement of the dielectric breakdown strength thereof. The dielectric breakdown strength of the substrate thus obtained was measured in accordance with the measurement method stipulated in JIS K 6249. The results thereof are shown in Table 5.

Test of Adhesion and Chemical Resistance of Photo-Curable Dry Films

Examples 21 to 25

Each of the top coat films of the respective afore-mentioned photo-curable dry films 1, 3, 4, 8, and 10 was removed; and then, the photo-curable resin layer on the supporting film was adhered onto a untreated 6 inch silicon wafer (substrate) by using the afore-mentioned vacuum laminator while setting inside the vacuum chamber at the evacuation degree of 100 Pa and the temperature of 100° C. After the pressure was resumed to a normal pressure, the substrate was cooled to 25° C., taken out from the vacuum laminator, and then, the supporting film was removed. After removal of the supporting film, the pre-baking thereof was carried out on a hot plate at 100° C. for 5 minutes.

Then, the substrate was exposed to a broad band light with the exposure dose of 1,000 mJ/cm$^2$ (365 nm wavelength) by using the afore-mentioned mask aligner via a quartz photomask. After the exposure, the substrate was heated (PEB) at 110° C. for 5 minutes, and then cooled. Thereafter, the one-minute puddle development was repeated for 5 times by using the aqueous 2.38% TMAH solution as a developer. Then, post-cure was carried out by using an oven whose temperature was controlled at 180° C. for 2 hours while purging therein with nitrogen to obtain the post-pattern cured film with the diameter of 300 μm and the height of 50 μm.

The resisting force during the time when the post-pattern cured film was removed from the substrate was measured by the bond tester Dage Series 4000-PXY (manufactured by Nordson Dage Corp.) to evaluate the initial adhesion of this post-pattern cured film. The measurement conditions with the measurement speed of 50.0 μm/second and the measurement height of 3.0 μm were used.

FIG. 1 is the illustrating drawing to show the adhesion measurement method. Meanwhile, in FIG. 1, numeral 1 shows the silicon wafer (substrate), 2 shows the post-pattern cured film, 3 shows the measurement jig of the bond tester, and 4 shows the moving direction of the measurement jig. The obtained value is the average of 15 measurement points; and the higher the value is, the higher the adhesion strength of the post-pattern cured film to the substrate is.

Then, a soldering flux liquid was applied to the post-pattern cured film on the substrate; and then, after heated at 220° C. for 30 seconds, it was washed by pure water, and then dried at room temperature for 2 hours. By using this dried post-pattern cured film, similarly to the measurement of the initial adhesion, the resisting force during the time when the pattern was removed from the substrate was measured by the above mentioned bond tester to evaluate the adhesion after deterioration.

Meanwhile, adhesions of 5 different photo-curable dry films were evaluated by comparing initial values; and also behaviors of decrease in the values from the initial to the after deterioration were evaluated by comparing them. By so doing, the adhesiveness as well as the chemical resistance to the soldering flux liquid was evaluated. These results are shown in Table 5.

[Test of Crack Resistance of Photo-Curable Dry Films]

Each of the top coat films of the respective afore-mentioned photo-curable dry films 1, 3, 4, 8, and 10 was removed; and then, the photo-curable resin layer on the supporting film was adhered onto a 6 inch silicon wafer (substrate), which was the same as that used in the afore-mentioned fill-up performance test, by using the afore-mentioned vacuum laminator while setting inside the vacuum chamber at the evacuation degree of 100 Pa and the temperature of 100° C. After the pressure was resumed to a normal pressure, the substrate was cooled to 25° C., taken out from the vacuum laminator, and then, the supporting film was removed. After removal of the supporting film, the pre-baking thereof was carried out on a hot plate at 100° C. for 5 minutes.

Then, the substrate was exposed to a broad band light with the exposure dose of 1,000 mJ/cm$^2$ (365 nm wavelength) by using the afore-mentioned mask aligner via a quartz photomask. After the exposure, the substrate was heated (PEB) at 110° C. for 5 minutes, and then cooled. Thereafter, the one-minute puddle development was repeated for 5 times by using the aqueous 2.38% TMAH solution as a developer. Then, post-cure was carried out by using an oven whose temperature was controlled at 180° C. for 2 hours while purging therein with nitrogen.

This substrate having the cured film formed thereon was put in the thermal cycle tester with the temperature of −55° C. to +150° C. as one cycle; and whether or not a crack was formed in the cured film till 1,000 cycles was studied. These results are shown in Table 5.

[Resistance of Photo-Curable Dry Films to Removing Liquid]

Each of the top coat films of the respective afore-mentioned photo-curable dry films 1, 3, 4, 8, and 10 was removed; and then, the photo-curable resin layer on the supporting film was adhered onto a untreated 6 inch silicon wafer (substrate) by using the afore-mentioned vacuum laminator while setting inside the vacuum chamber at the evacuation degree of 100 Pa and the temperature of 100° C. After the pressure was resumed to a normal pressure, the substrate was cooled to 25° C., taken out from the vacuum laminator, and then, the supporting film was removed. After removal of the supporting film, the pre-baking thereof was carried out on a hot plate at 100° C. for 5 minutes.

Then, the substrate was exposed to a broad band light with the exposure dose of 1,000 mJ/cm$^2$ (365 nm wavelength) by using the afore-mentioned mask aligner via a quartz photomask. After the exposure, the substrate was heated (PEB) at 110° C. for 5 minutes, and then cooled. Thereafter, the one-minute puddle development was repeated for 5 times by using the aqueous 2.38% TMAH solution as a developer. Then, post-cure was carried out by using an oven whose temperature was controlled at 180° C. for 2 hours while purging therein with nitrogen to obtain the cured 15 mm×15 mm square pattern film.

This substrate having the cured film formed thereon was soaked in NMP (N-methylpyrrolidone) at room temperature for 1 hour; and then, the changes in the appearance and the film thickness were studied to evaluate the resistance to the removing liquid. These results are shown in Table 5.

TABLE 5

| | Photo-curable dry film | Electric characteristics Dielectric breakdown strength (V/um) | Adhesiveness | | Crack resistance (after thermal cycle test) | Resistance to removing liquid (after soaking in NMP) |
|---|---|---|---|---|---|---|
| | | | Initial (mN) | After deterioration (mN) | | |
| Example 21 | Photo-curable dry film 1 | 350 | 320 | 270 | No crack | No change in appearance and film thickness |
| Example 22 | Photo-curable dry film 3 | 350 | 330 | 270 | No crack | No change in appearance and film thickness |
| Example 23 | Photo-curable dry film 4 | 350 | 370 | 270 | No crack | No change in appearance and film thickness |

TABLE 5-continued

| Photo-curable dry film | Electric characteristics Dielectric breakdown strength (V/um) | Adhesiveness Initial (mN) | Adhesiveness After deterioration (mN) | Crack resistance (after thermal cycle test) | Resistance to removing liquid (after soaking in NMP) |
|---|---|---|---|---|---|
| Example 24 | Photo-curable dry film 8 | 350 | 370 | 290 | No crack | No change in appearance and film thickness |
| Example 25 | Photo-curable dry film 10 | 350 | 330 | 280 | No crack | No change in appearance and film thickness |

As shown in Table 5, the cured film obtained by patterning of the photo-curable dry film of the present invention was excellent as the top coat film to protect electric and electronic parts all in electric characteristics, adhesiveness, chemical resistance, crack resistance, and resistance to the removing liquid.

As can be seen above, according to the present invention, a polymer compound useful as a base resin of a chemically amplified negative resist composition which can drastically improve the problem of delamination generated on metal wires such as Cu and Al, an electrode, and a substrate, especially the substrate such as SiN, as well as a chemically amplified negative resist composition using this polymer compound can be obtained. In addition, by using this chemically amplified negative resist composition, a fine pattern can be formed without generating a scum and a footing profile in a wide range of wavelength; and moreover, miniaturization of the pattern is possible in the rewiring technology in accordance with the trends to higher density and higher integration of chips. Moreover, this chemically amplified negative resist composition can be developed by an aqueous alkaline solution including the aqueous TMAH solution, whereby providing a photo-curable dry film using this chemically amplified negative resist composition and a patterning process using this photo-curable dry film. When the pattern formed by the patterning process like this is post-cured at low temperature, a substrate protected by a cured film having excellent flexibility, heat resistance, electric characteristics, adhesiveness, reliability, chemical resistance, crack resistance, and fill-up performance can be obtained. That is, the chemically amplified negative resist composition of the present invention and the photo-curable dry film using this can give a top coat film suitable to protect electric and electronic parts, a semiconductor device, and the like.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A polymer compound, wherein the polymer compound comprises a carboxyl group and a siloxane chain and is obtained in the presence of an acid catalyst by condensation of at least
   (I) a siloxane compound comprising phenol groups at both terminals, as shown by the following general formula (1),

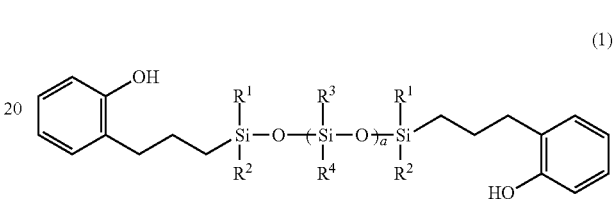

wherein $R^1$ to $R^4$ are each individually a monovalent hydrocarbon group having 1 to 8 carbon atoms; and "a" represents an integer of 1 to 100,
(II) phenols shown by the following general formula (2) and/or phenols shown by the following general formula (3),

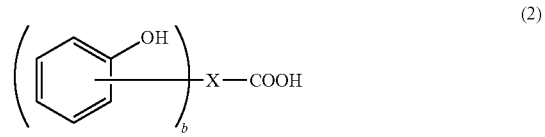

wherein "b" is 1 or 2; and X represents a single bond or a divalent organic group when "b" is 1, or a trivalent organic group when "b" is 2,

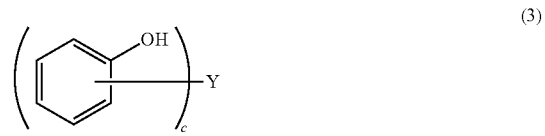

wherein "c" is 1 or 2; and Y represents a monovalent substituent group selected from a hydrogen atom, an alkyl group having 1 to 6 carbon atoms, a hydroxyl group, and a halogen atom when "c" is 1, or a divalent organic group optionally containing an atom of Si, S, or O when "c" is 2, and
(III) one or more kinds of aldehydes and ketones shown by the following general formula (4),

wherein $R^5$ represents a hydrogen atom or a methyl group; and Z represents a divalent alkylene group or an aromatic group having 1 to 12 carbon atoms.

2. The polymer compound according to claim 1, wherein the polymer compound is obtained in the presence of an acid catalyst by condensation by further adding (IV) one or more kinds of aldehydes and ketones shown by the following general formula (5),

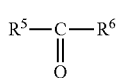
(5)

wherein $R^5$ represents the same meaning as before; and $R^6$ represents a hydrogen atom, an alkyl group or an aromatic group having 1 to 15 carbon atoms, wherein $R^5$ and $R^6$ may be connected by a single bond or an alkylene group having 1 to 15 carbon atoms to form a ring.

3. The polymer compound according to claim 1, wherein the siloxane compound comprising phenol groups at both terminals as shown by the following general formula (1) is a compound shown by the following general formula (6),

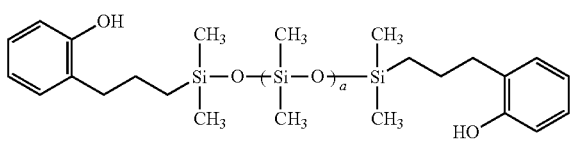
(6)

wherein "a" represents the same meaning as before.

4. The polymer compound according to claim 1, wherein the phenols shown by the general formula (2) are any of compounds shown by the following general formulae (7)

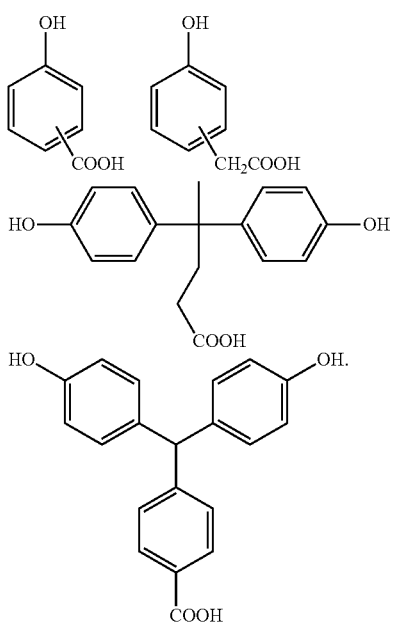
(7)

5. The polymer compound according to claim 1, wherein the phenols shown by the general formula (3) are compounds shown by the following general formula (8),

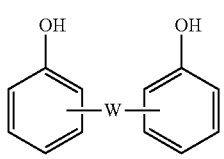
(8)

wherein W represents a divalent organic group having any of the structures shown by the following general formulae (9),

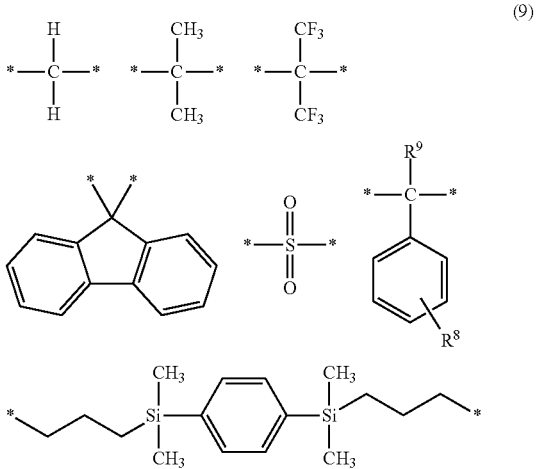
(9)

wherein $R^8$ represents a monovalent substituent group selected from a hydrogen atom, an alkyl group having 1 to 6 carbon atoms, a hydroxyl group, and a halogen atom; and $R^9$ represents a hydrogen atom or a methyl group.

6. The polymer compound according to claim 1, wherein one of the aldehydes and the ketones shown by the general formula (4) is a compound shown by the following general formula (10)

(10)

7. The polymer compound according to claim 2, wherein one of the aldehydes and the ketones shown by the general formula (5) is a compound shown by the following general formula (11),

(11)

wherein $R^7$ represents a hydrogen atom, an alkyl group having 1 to 6 carbon atoms, or a halogen atom.

8. The polymer compound according to claim 2, wherein one of the aldehydes and the ketones shown by the general formula (5) is formaldehyde.

9. The polymer compound according to claim 1, wherein the polymer compound has repeating units shown by the following general formula (12) and weight average molecular weight in the range of 3,000 to 500,000,

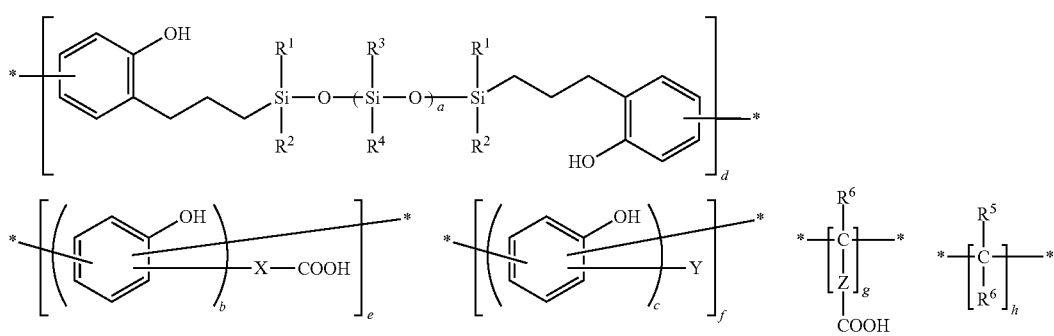

(12)

wherein $R^1$ to $R^6$, "a", "b", "c", X, and Y, and Z represent the same meanings as before; "d" and "g" represent a positive number; "e", "f", and "h" represent 0 or a positive number; and d+e+f+g+h=1.

10. The polymer compound according to claim 9, wherein in the general formula (12), "d" represents 0<d≤0.5, "e" represents 0≤e≤0.3, "g" represents 0<g<0.8, and "h" represents 0≤h≤0.5.

11. A chemically amplified negative resist composition comprising:
(A) the polymer compound according to claim 1,
(B) one or more crosslinking agents selected from the group consisting of an amino condensate modified by formaldehyde or formaldehyde-alcohol, a phenol compound having an average of 2 or more methylol groups or alkoxy methylol groups in one molecule, and a compound comprising a hydroxyl group of a polyvalent phenol thereof substituted by a glycidoxy group,
(C) a photosensitive acid generator which generates an acid by decomposition thereof by a light having wavelength of 190 to 500 nm, and
(D) a solvent.

12. A photo-curable dry film, wherein the photo-curable dry film has a structure that a photo-curable resin layer having a film thickness of 10 to 100 μm is sandwiched between a supporting film and a top coat film, in which the photo-curable resin layer is formed by the chemically amplified negative resist composition according to claim 11.

13. A method for producing a photo-curable dry film, wherein the method comprises:
(i) a step of continuously applying the chemically amplified negative resist composition according to claim 11 onto a supporting film to form a photo-curable resin layer,
(ii) a step of continuously drying the photo-curable resin layer, and further
(iii) a step of laminating a top coat film onto the photo-curable resin layer.

14. A layered product comprising the photo-curable resin layer of the photo-curable dry film according to claim 12 laminated on a substrate having a trench and/or a hole with an aperture width thereof in the range of 10 to 100 μm and the depth thereof in the range of 10 to 120 μm.

15. A patterning process comprising:
a step of applying the chemically amplified negative resist composition according to claim 11 onto a substrate to form a resist film,
a step of exposing the resist film to a high energy beam having a wavelength of 190 to 500 nm or an electron beam via a photomask after heat treatment, and
a step of development by using a developer after heat treatment.

16. A patterning process comprising:
a step of adhering onto a substrate a photo-curable resin layer which becomes exposed by delaminating the top coat film from the photo-curable dry film according to claim 12,
a step of exposing the photo-curable resin layer to a high energy beam having a wavelength of 190 to 500 nm or an electron beam via a photomask under the state of intervention of the supporting film or under the state of the supporting film delaminated,
a step of heat treatment after the exposure, and
a step of development by a developer.

17. The patterning process according to claim 15, wherein the patterning process further comprises a step of post-curing a patterned film formed by the development at 100 to 250° C. after the step of development.

18. The patterning process according to claim 16, wherein the patterning process further comprises a step of post-curing a patterned film formed by the development at 100 to 250° C. after the step of development.

19. The patterning process according to claim 16, wherein the substrate comprises a trench and/or a hole with an aperture width thereof in the range of 10 to 100 μm and the depth thereof in the range of 10 to 120 μm.

20. A substrate which is protected by a film which is obtained by curing the pattern formed by the patterning process according to claim 15.

21. A substrate which is protected by a film which is obtained by curing the pattern formed by the patterning process according to claim 16.

* * * * *